US012165229B1

(12) United States Patent
Carroll

(10) Patent No.: US 12,165,229 B1
(45) Date of Patent: Dec. 10, 2024

(54) ARTIFICIAL INTELLIGENCE-BASED LAND AND BUILDING DEVELOPMENT SYSTEM

(71) Applicant: CoreLogic Solutions, LLC, Irvine, CA (US)

(72) Inventor: Peter Carroll, Bethesda, MD (US)

(73) Assignee: CoreLogic Solutions, LLC, Irvine, CA (US)

(*) Notice: Subject to any disclaimer, the term of this patent is extended or adjusted under 35 U.S.C. 154(b) by 690 days.

(21) Appl. No.: 17/196,790

(22) Filed: Mar. 9, 2021

Related U.S. Application Data

(60) Provisional application No. 62/987,816, filed on Mar. 10, 2020.

(51) Int. Cl.
| | |
|---|---|
| G06Q 50/16 | (2024.01) |
| G06F 16/29 | (2019.01) |
| G06F 18/214 | (2023.01) |
| G06F 30/13 | (2020.01) |
| G06N 20/00 | (2019.01) |

(52) U.S. Cl.
CPC ........... *G06Q 50/165* (2013.01); *G06F 16/29* (2019.01); *G06F 18/214* (2023.01); *G06F 30/13* (2020.01); *G06N 20/00* (2019.01)

(58) Field of Classification Search
None
See application file for complete search history.

(56) References Cited

U.S. PATENT DOCUMENTS

| | | | | |
|---|---|---|---|---|
| 2006/0238383 | A1* | 10/2006 | Kimchi | G09B 29/106 |
| | | | | 340/995.1 |
| 2009/0172600 | A1* | 7/2009 | YaJun | G06T 17/05 |
| | | | | 715/851 |
| 2018/0357720 | A1* | 12/2018 | Grant | G06Q 40/08 |
| 2019/0164240 | A1* | 5/2019 | Barbara | G06F 16/909 |
| 2019/0220759 | A1* | 7/2019 | Tierney | G06T 17/05 |

(Continued)

OTHER PUBLICATIONS

Gerretw, "Editing a floor plan image," [online], available at: < https://forums.sketchup.com/t/editing-a-floor-plan-image/25877 >, published on May 2016 (Year: 2016).*

(Continued)

*Primary Examiner* — Richard W. Crandall
(74) *Attorney, Agent, or Firm* — Knobbe, Martens, Olson & Bear LLP

(57) ABSTRACT

A development management system is described herein that may provide a unified portal that depicts an interactive user interface accessible to a developer and various stakeholders in a region at which a development is planned. Within the unified portal, the developer can provide and/or access certain sets of data. In addition, other stakeholders in the region at which a development is planned can access the unified portal and provide access-controlled data that may otherwise be unavailable to the developer. The unified portal may allow the developer and/or the stakeholders to monitor the progress of a development, provide input as to various design elements that may comprise the development, to provide or request additional information as needed, to select a location at which the development will occur with the aid of artificial intelligence, and to review and revise a layout of the proposed development graphically depicted via the user interface.

22 Claims, 11 Drawing Sheets

(56) References Cited

U.S. PATENT DOCUMENTS

2020/0043110 A1\* 2/2020 Kalyanasundaram ....................... G06F 16/9537

OTHER PUBLICATIONS

URBDP 573: "Tutorial 51.—SketchUp / Google Earth" [online], archived on Oct. 27, 2011, available at: < https://web.archive.org/web/20111027201507/https://courses.washington.edu/udpddp/exercises/tu51.shtml > (note, the pictures are included in the website from google: (see OA) (Year: 2011).\*

Architectures.com, archived on Jan. 29, 2019, available at: < https://web.archive.org/web/20190129013436/https://architechtures.com/ > (Year: 2019).\*

\* cited by examiner

ARTIFICIAL INTELLIGENCE-BASED LAND AND BUILDING DEVELOPMENT SYSTEM

CROSS-REFERENCE TO RELATED APPLICATIONS

This application claims the benefit of U.S. Provisional Application No. 62/987,816, entitled "OVERVIEW OF FEATURES AND FUNCTIONS OF HABEAS" and filed on Mar. 10, 2020, which is hereby incorporated by reference herein in its entirety.

TECHNICAL FIELD

The present disclosure generally relates to a land and building development system that uses artificial intelligence to identify graphically a location at which to develop a building and characteristics of the building.

BACKGROUND

Urban planning, including land and housing development, can transform regions and improve the standard of living for those residing therein. Urban planning, however, can be time-consuming and technically complex. For example, it can be difficult to identify a plot of land on which housing can be developed, what type of housing can be developed therein, and/or how the housing should be configured given various city requirements, zoning ordinances, physical space constraints, load on infrastructure (e.g., roads, water systems, sewage systems, power grid, gas distribution, etc.), and/or other considerations. Existing computing systems are available to help with certain aspects of urban planning. However, such existing computing systems lack features that can improve the efficiency of planning and implementing a development and the structural integrity of a development that is planned.

SUMMARY

The systems, methods, and devices described herein each have several aspects, no single one of which is solely responsible for its desirable attributes. Without limiting the scope of this disclosure, several non-limiting features will now be discussed briefly.

One aspect of the disclosure provides a development management system for building a housing development. The development management system comprises memory storing computer-executable instructions. The development management system further comprises a hardware processor in communication with the memory, where the computer-executable instructions, when executed by the hardware processor, cause the hardware processor to: process a selection of one or more development parameters received via a user interface; obtain region data for a region selected via the user interface, where the user interface displays a geographic map depicting the region, and where the region data comprises at least one of census data, parcel data, zoning data, or neighborhood data for the region; apply the region data and the one or more development parameters as an input to an artificial intelligence model trained to rank one or more neighborhoods in the region; cause the user interface to depict a ranking of the one or more neighborhoods in the region and a graphical representation of a highest ranked neighborhood in the ranking of the one or more neighborhoods in the geographic map in response to the artificial intelligence model producing an output; obtain a selection of a parcel in the highest ranked neighborhood; generate a building configuration for the identified parcel that satisfies one or more building constraints; and cause the user interface to depict a graphical representation of the generated building configuration.

The development management system of the preceding paragraph can include any sub-combination of the following features: where the computer-executable instructions, when executed, further cause the hardware processor to: obtain zoning, structure, or construction data for the highest ranked neighborhood, apply the zoning data, the structure data, the construction data, and the one or more development parameters as an input to a second artificial intelligence model trained to identify a parcel on which to build the housing development, and obtain the selection of the parcel in the highest ranked neighborhood in response to the second artificial intelligence model producing an output; where the geographic map displays the geographic map depicting the region and the highest ranked neighborhood in the region prior to the region data and the one or more development parameters being applied as the input to the artificial intelligence model, and where the computer-executable instructions, when executed, further cause the hardware processor to cause the user interface to modify an appearance of the graphical representation of the highest ranked neighborhood to depict the parcel and one or more other parcels within a boundary of the graphical representation of the highest ranked neighborhood; where the computer-executable instructions, when executed, further cause the hardware processor to cause the user interface to depict a graphical representation of the parcel within the boundary of the graphical representation of the highest ranked neighborhood with a color that represents a land use of the parcel; where the building configuration comprises a data structure comprising data that represents a layout of the housing development; where the layout of the housing development comprises a layout of one or more floors of the housing development; where the graphical representation of the generated building configuration comprises a three-dimensional model of the housing development; where the computer-executable instructions, when executed, further cause the hardware processor to process a modification to the three-dimensional model received via the user interface; where the computer-executable instructions, when executed, further cause the hardware processor to modify the generated building configuration in accordance with the modification to the three-dimensional model; and where the computer-executable instructions, when executed, further cause the hardware processor to instruct a construction system to one of cause a printer to begin printing a part for constructing the housing development in accordance with the generated building configuration, cause an unmanned aerial vehicle to capture an aerial image of a location of the parcel, or cause construction equipment to begin performing one or more construction actions in accordance with the generated building configuration.

Another aspect of the disclosure provides a computer-implemented method for building a housing development. The computer-implemented method comprises: as implemented by one or more computing devices configured with specific computer-executable instructions, receiving a selection of one or more development parameters via a user interface; obtaining region data for a region selected via the user interface, where the user interface displays a geographic map depicting the region, and where the region data comprises at least one of census data, parcel data, zoning data, or neighborhood data for the region; applying the region data and the one or more development parameters as an input to an artificial intelligence model; causing the user interface to depict a ranking of the one or more neighborhoods in the region output by the artificial intelligence model and a graphical representation of a first neighborhood in the one or more neighborhoods in the geographic map in response to the artificial intelligence model producing the output; obtaining a selection of a parcel in the first neighborhood; generating a building configuration for the identified parcel that satisfies one or more building constraints; and causing the user interface to depict a graphical representation of the generated building configuration.

The computer-implemented method of the preceding paragraph can include any sub-combination of the following features: where obtaining a selection of a parcel in the first neighborhood further comprises: obtaining zoning, structure, or construction data for the first ranked neighborhood, applying the zoning data, the structure data, the construction data, and the one or more development parameters as an input to a second artificial intelligence model, and obtaining the selection of the parcel in the first neighborhood in response to the second artificial intelligence model producing an output; where the geographic map displays the geographic map depicting the region and the first neighborhood in the region prior to the region data and the one or more development parameters being applied as the input to the artificial intelligence model, and where cause the user interface to depict a ranking of the one or more neighborhoods in the region output by the artificial intelligence model and a graphical representation of a first neighborhood in the one or more neighborhoods in the geographic map further comprises causing the user interface to modify an appearance of the graphical representation of the first neighborhood to depict the parcel and one or more other parcels within a boundary of the graphical representation of the first neighborhood; where causing the user interface to modify an appearance of the graphical representation of the first neighborhood further comprises causing the user interface to depict a graphical representation of the parcel within the boundary of the graphical representation of the first neighborhood with a color that represents a land use of the parcel; where the building configuration comprises a data structure comprising data that represents a layout of the housing development; where the graphical representation of the generated building configuration comprises a three-dimensional model of the housing development; where the computer-implemented method further comprises: processing a modification to the three-dimensional model received via the user interface, and modifying the generated building configuration in accordance with the modification to the three-dimensional model; and where the computer-implemented method further comprises instructing a construction system to one of cause a printer to begin printing a part for constructing the housing development in accordance with the generated building configuration, cause an unmanned aerial vehicle to capture an aerial image of a location of the parcel, or cause construction equipment to begin performing one or more construction actions in accordance with the generated building configuration.

Another aspect of the disclosure provides non-transitory, computer-readable storage media comprising computer-executable instructions for building a housing development, where the computer-executable instructions, when executed by a computer system, cause the computer system to: process a selection of one or more development parameters received via a user interface; obtain region data for a region selected via the user interface, where the user interface displays a geographic map depicting the region, and where the region data comprises at least one of census data, parcel data, zoning data, or neighborhood data for the region; apply the region data and the one or more development parameters as an input to an artificial intelligence model; cause the user interface to depict a ranking of the one or more neighborhoods in the region output by the artificial intelligence model and a graphical representation of a first neighborhood in the one or more neighborhoods in the geographic map in response to the artificial intelligence model producing the output; obtain a selection of a parcel in the first neighborhood; generate a building configuration for the identified parcel that satisfies one or more building constraints; and cause the user interface to depict a graphical representation of the generated building configuration.

The non-transitory, computer-readable storage media of the preceding paragraph can include any sub-combination of the following features: where the computer-executable instructions further cause the computer system to instruct a construction system to one of cause a printer to begin printing a part for constructing the housing development in accordance with the generated building configuration, cause an unmanned aerial vehicle to capture an aerial image of a location of the parcel, or cause construction equipment to begin performing one or more construction actions in accordance with the generated building configuration.

BRIEF DESCRIPTION OF DRAWINGS

Throughout the drawings, reference numbers may be re-used to indicate correspondence between referenced elements. The drawings are provided to illustrate example embodiments described herein and are not intended to limit the scope of the disclosure.

DETAILED DESCRIPTION OF SPECIFIC EMBODIMENTS

Figure 1:
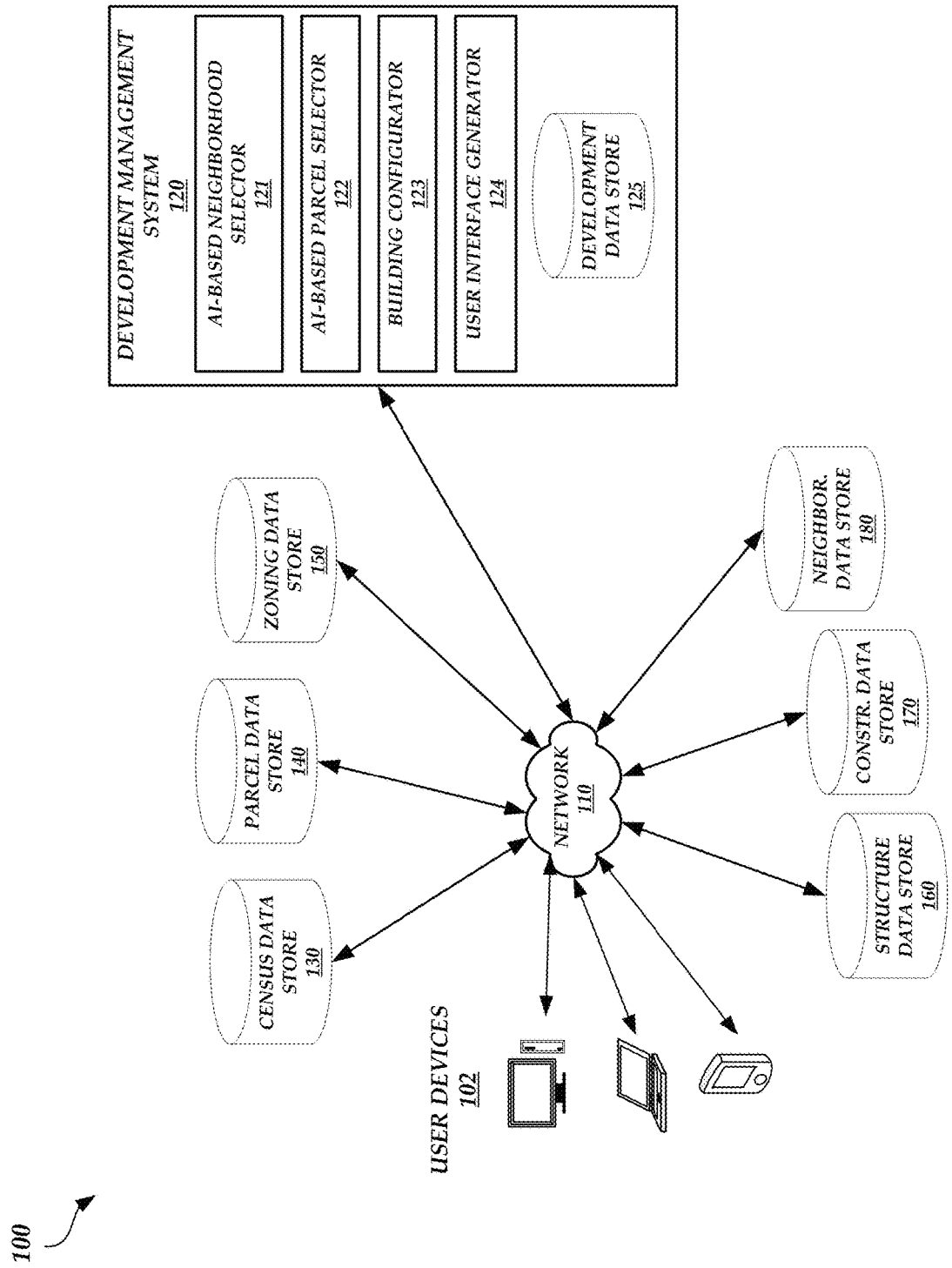
FIG. 1 is a block diagram of an illustrative operating environment in which a development management system uses obtained data to identify a neighborhood or census tract and/or parcel at which to build a housing development and to generate and render a graphical representation of a housing development configuration.

As explained above, urban planning, including land and housing development, can transform regions and improve the standard of living for those residing therein. Urban planning, however, can be time-consuming and technically complex. For example, it can be difficult to identify a plot of land on which housing can be developed, what type of housing can be developed therein, and/or how the housing should be configured given various city requirements, zoning ordinances, physical space constraints, load on infrastructure (e.g., roads, water systems, sewage systems, power grid, gas distribution, etc.), and/or other considerations.

Certain existing computing systems and applications allow a user to manage a housing project from planning to completion. For example, such computing systems and applications may allow a user to generate a development concept, conduct a feasibility study, secure financing, begin construction, and find buyer(s). In particular, these existing computing systems and applications may gather data related to the development and display the data in various tables in a user interface. A user can then use the displayed data to make decisions regarding the development, such as where the development should be located, when to begin construction, and/or the like.

However, these existing computing systems and applications have several technical deficiencies. For example, the type of data gathered by these existing computing systems and applications may be limited to data already available to the user. Often, the information needed to efficiently and safely build a housing development includes both data already available to the user and data only available to other stakeholders. As one example, other stakeholders may include local agencies, district commissions, and/or other land development officials of a particular municipality, and the data available to these stakeholders may include zoning regulations, land use regulations, and/or other similar data. Existing computing systems and applications provide no mechanism for accessing, incorporating, and/or using data existing in other computing systems and available to other stakeholders.

As another example, while the existing computing systems and applications may lack access to relevant data, the volume of data gathered and displayed may still be voluminous. As a result, the existing computing systems and applications often display the table(s) of data in multiple pages, tabs, and/or windows and/or include scroll bars to allow vertical and/or horizontal navigation. For example, one window may include a table displaying market research data, another window may include a table displaying data from a feasibility study, another window may include a table displaying financial data, and so on. Thus, existing computing systems and applications are unable to display all of the relevant data within a single view, which causes a user to perform additional navigational steps (e.g., scrolling, selecting items or menus, selecting page numbers, browsing back and/or forward, etc.) to view the relevant data. The inability to view relevant data within a single view can cause a user to miss critical data, which could lead to unsafe building designs, housing being planned in otherwise dangerous or hazardous locations (e.g., locations with a high crime rate; near industrial and/or other facilities that handle toxic substances; susceptible to natural disasters like earthquakes, tornadoes, hurricanes, floods, lightning strikes, etc.; etc.), and/or the like.

As another example, existing computing systems and applications merely present data to users. Existing computing systems and applications provide no mechanism for interpreting or processing the data to provide a design service that could improve the structural integrity or safety of a housing development that is being planned. For example, a system that could process available data to generate automatically a building configuration and render an interactive graphical representation of the building configuration could allow a user to design and construct a building that meets local safety regulations, that uses the land efficiently (e.g., to reduce environmental waste, to reduce the negative effects of disturbances (e.g., light pollution, noise pollution, environmental pollution, etc.) caused by surrounding properties, etc.), that is constructed of materials that are more likely to last given historical weather patterns in the region, that reduces traffic congestion in the region, and/or the like.

Accordingly, described herein is a development management system that addresses the technical deficiencies described above. For example, the development management system may provide a unified portal accessible to not only a developer, but also to various stakeholders in the region at which a development is planned. Within the unified portal, the developer can provide and/or access certain sets of data, such as census data, parcel data, structure data, construction data, and/or neighborhood or census tract data. In addition, other users or stakeholders in the region at which a development is planned can access the unified portal and provide access-controlled data that may otherwise be unavailable to the developer. Such data can include zoning data, other parcel data, and/or the like. The unified portal may allow the developer and/or the stakeholders to monitor the progress of a development, provide input as to various design elements that may comprise the development, and/or to provide or request additional information as needed.

The unified portal may provide additional technical features that reduce the number of navigational steps that a user (e.g., a developer, a stakeholder, etc.) may perform to view relevant data. For example, the unified portal may produce an interactive user interface that provides, within a single view, the ability to view any or all of the data accessible to the development management system in different layers that can be toggled on and off and that overlay a geographic map of an area at which a development is planned. Thus, a user may be able to view any relevant data without having to perform additional navigational steps, such as scrolling horizontally or vertically (e.g., scrolling to view a below-the-fold portion of the user interface, which may be the portion of the user interface that is not initially visible once the user interface is rendered and displayed and that is only visible after a scrolling action is performed), navigating to different pages, tabs, and/or windows, and/or the like. In other words, any relevant data that a user wishes to view may be available in the above-the-fold portion of the user interface (e.g., the portion of the user interface that is initially visible once the user interface is rendered and displayed).

One of the difficulties in the land and/or housing development process is identifying the appropriate parcel to develop. The development management system may use artificial intelligence to identify a neighborhood or census tract at which to locate a development based on user-provided parameters and/or accessible data. Once identified, the development management system may automatically cause the user interface depicted via the unified portal to highlight, annotate, zoom in on, or otherwise emphasize the identified neighborhood or census tract. In addition, the development management system may use artificial intelligence to identify a parcel in the identified neighborhood or census tract at which to locate the development based on user-provided parameters and/or accessible data. Once identified, the development management system may automatically cause the user interface depicted via the unified portal to highlight, annotate, zoom in on, or otherwise emphasize the identified parcel. Thus, the user interface may automatically focus the user on a location at which to develop and display relevant information without any user interaction, such as without requiring the user to perform one or more navigational steps. As a result, the development management system may produce an improved user interface that can, within a single view, display relevant data and automatically manipulate the data that is displayed while reducing the number of navigational steps that a user may have to perform.

Finally, the development management system can allow a user to construct a safe, structurally sound development by automatically generating a building configuration and rendering a graphical representation of the generated building configuration (e.g., a two-dimensional or three-dimensional model of a building having a certain configuration) for display within the user interface. For example, the development management system can use provided data to identify a building configuration and/or characteristics of a building that may satisfy local building codes, that may reduce the negative effects of nearby pollution (e.g., light, noise, environmental, etc.), that is constructed of materials that are more likely to last given historical weather patterns in the region, that reduces traffic congestion in the region (e.g., that is configured to have a certain occupancy that may reduce traffic congestion or reduce the increase in traffic congestion over a threshold period of time), and/or the like. The development management system can then generate one or more floorplans for the building in accordance with the building configuration and/or building characteristics, graphically depicting the generated one or more floorplans via a two-dimensional and/or three-dimensional model visible in the user interface. A user can manipulate the appearance of the two-dimensional and/or three-dimensional model via the user interface (e.g., pan, zoom in, zoom out, rotate, hide or make visible certain floors, hide or make visible certain fixtures or finishings in the building, hide or make visible certain construction materials, etc.) and/or can modify the two-dimensional and/or three-dimensional model itself via the user interface (e.g., add or remove a room, add or remove a bathroom, modify the size of a room, add or remove fixtures or finishings, add or remove a floor, etc.). Once finalized, the development management system can transmit the floorplan(s), building models, blueprints, and/or similar materials to a construction system, and the construction system can automatically order material(s) to be used in construction of the building, cause a three-dimensional printer to begin printing one or more parts for use in construction of the building, cause an unmanned aerial vehicle to fly to a location at which the development is planned and captures aerial images, cause construction equipment (e.g., autonomous or semi-autonomous bulldozers, cranes, cement mixers, etc.) to begin performing one or more construction actions (e.g., leveling a parcel, lifting beams, mixing cement, etc.), and/or the like in response to receiving this information.

While the present disclosure describes the development management system as providing tools for allowing a user to develop a residential housing project, this is not meant to be limiting. The operations described herein as being performed by the development management system can be performed by the development management system to develop any type of land or building, such as a park, a nature preserve, a commercial building (e.g., an office building, a retail center, etc.), an industrial building (e.g., a warehouse), infrastructure (e.g., power transmission lines, a pipeline, a water plant, a power plant, etc.), and/or the like.

The foregoing aspects and many of the attendant advantages of this disclosure will become more readily appreciated as the same become better understood by reference to the following detailed description, when taken in conjunction with the accompanying drawings.

Example Land and Housing Development Environment

FIG. 1 is a block diagram of an illustrative operating environment 100 in which a development management system 120 uses obtained data to identify a neighborhood or census tract and/or parcel at which to build a housing development and to generate and render a graphical representation of a housing development configuration. The operating environment 100 further includes a census data store 130, a parcel data store 140, a zoning data store 150, a structure data store 160, a construction data store 170, and a neighborhood data store 180 that may each communicate with the development management system 120 via a network 110 to provide data to enable the functionality described herein. Furthermore, the operating environment 100 includes various user devices 102 that may communicate with the development management system 120 to initiate the planning of a housing development, to provide additional data useful in planning the housing development, to monitor the progress of the housing development, and/or to initiate construction of the housing development.

The census data store 130 may store historical and/or current census data for one or more geographic regions. For example, census data may include the population of a particular geographic region (optionally delineated by race, gender, religion, socioeconomic status, etc.), income statistics of a particular geographic region (e.g., median household income, median income by race, median income by gender, median income by religion, average household income, etc.), crime statistics of a particular geographic region, educational levels and/or quality of education in a particular geographic region, employment levels in a particular geographic region, and/or the like. While the census data store 130 is depicted as being located external to the development management system 120, this is not meant to be limiting. For example, not shown, the census data store 130 can be located internal to the development management system 120.

The parcel data store 140 may store parcel data for one or more neighborhoods or census tracts in one or more geographic regions. For example, parcel data may include geographical boundaries of one or more parcels in a particular neighborhood or census tract, other geospatial location data for one or more parcels in a particular neighborhood or census tract, average price per square foot for a parcel in a particular neighborhood or census tract, quality land use of one or more parcels in a particular neighborhood or census tract (e.g., whether a parcel is used as a church or other religious facility; for arts and culture; for education; as a hospital or other medical facility; for parks and recreation; as federal, state, or local property; for police, fire, or civil defense services; for public transit; for retail or commerce; as a supermarket; or has another use), a buildability score of one or more parcels in a particular neighborhood or census tract, whether one or more parcels in a particular neighborhood or census tract is in an opportunity zone, an identifier (e.g., an address and/or assessor's parcel number (APN)) of one or more parcels in a particular neighborhood or census tract, a value of one or more parcels in a particular neighborhood or census tract, a property tax for one or more parcels in a particular neighborhood or census tract, an identification of an owner of one or more parcels in a particular neighborhood or census tract, acreage or square footage of one or more parcels in a particular neighborhood or census tract, sales history of one or more parcels in a particular neighborhood or census tract, other market listings data (e.g., sales price, whether a parcel is listed for sale, when a parcel was de-listed from sale, etc.) for one or more parcels in a particular neighborhood or census tract, and/or the like. While the parcel data store 140 is depicted as being located external to the development management system 120, this is not meant to be limiting. For example, not shown, the parcel data store 140 can be located internal to the development management system 120.

The zoning data store 150 may store zoning data for one or more parcels in one or more neighborhoods or census tracts in one or more geographic regions. For example, the zoning data may include current or future zoning regulations for a particular neighborhood or census tract, current or future zoning regulations for a particular parcel (e.g., whether the parcel is zoned to be commercial, single family residential, multifamily residential (e.g., apartment, condominium, duplex, triplex, quadplex, etc.), industrial, vacant, parkland, etc.), and/or the like. While the zoning data store 150 is depicted as being located external to the development management system 120, this is not meant to be limiting. For example, not shown, the zoning data store 150 can be located internal to the development management system 120.

In further embodiments, the development management system 120 can predict future zoning data for a parcel or neighborhood. For example, the development management system 120 may have access to census data, hazard data (e.g., data describing characteristics, measured values (e.g., precipitation, temperature, hail size, wind speed, etc.), and/or other similar information for historical, current, and/or predicted hazards, such as wind events, hail, ice storms, lightning strikes, floods, hurricanes, tornadoes, storm surge, earthquakes, mudslides, wildfires, and/or the like), and/or other similar data. Using such data, the development management system 120 can predict how a hazard may impact the population of a parcel or neighborhood in the future or over a period of time, such as whether flooding may become more frequent in a parcel or neighborhood, whether the parcel or neighborhood may become more arid over time, etc. If the development management system 120 predicts that a hazard may impact a neighborhood or parcel more or less frequently over time and that the neighborhood or parcel has a certain population (e.g., less than a threshold, greater than a threshold, within a particular range, etc.), then the development management system 120 may further predict how zoning regulations may change over time given the predicted hazard and population information. As an illustrative example, if the development management system 120 predicts that flooding may become more frequent in a parcel or neighborhood over time and that the population exceeds a threshold, then the development management system 120 may further predict that the zoning regulations for the parcel or neighborhood may be changed from multifamily use to single family use or from residential to commercial.

As another example, the development management system 120 can obtain news data (e.g., articles, publications, wire reports, etc.) corresponding to a particular parcel or neighborhood and apply natural language processing to the obtained news data to determine a sentiment of the news for the purpose of predicting future zoning data. For example, the development management system 120 can apply a sentiment analysis to the obtained news data to determine whether the news has a positive sentiment or a negative sentiment. The development management system 120 can track the sentiment for a particular parcel or neighborhood over time to determine whether the sentiment generally trends negative or positive. If a sentiment generally trends negative, this may indicate that the neighborhood or parcel is becoming more dangerous or otherwise undesirable. As a result, the development management system 120 may predict that future zoning regulations may be changed from single family to multifamily or from residential to industrial. Similarly, if a sentiment generally trends positive, this may indicate that the neighborhood or parcel is becoming less dangerous or otherwise more desirable. As a result, the development management system 120 may predict that future zoning regulations may be changed from industrial to residential, from commercial to residential, etc. The development management system 120 may use predicted future zoning data, in place of or in conjunction with current zoning data, to select a neighborhood, select a parcel, and/or to generate a building configuration in a manner as described herein.

The structure data store 160 may store structure data for one or more parcels in one or more neighborhoods or census tracts in one or more geographic regions. For example, the structure data may include, for a particular parcel, an indication of the materials used to construct a structure on the respective parcel (e.g., roof material (e.g., shingles, tile, etc.), siding material (e.g., wood, stucco, etc.), window material (e.g., single-pane, double-pane, etc.), door material (e.g., metal, wood, vinyl, etc.), etc.), a quality of materials used to construct a structure on the respective parcel, fixtures or finishings installed in the structure on the respective parcel, the number of bedrooms in the structure on the respective parcel, the number of bathrooms in the structure on the respective parcel, the number of floors in the structure on the respective parcel, the square footage of the structure on the respective parcel, an age of the structure on the respective parcel, damage that has previously or currently affected the structure on the respective parcel, a number of structures present on the respective parcel, a spatial layout of bedrooms, bathrooms, closets, garages, etc. in the structure on the respective parcel, and/or the like. While the structure data store 160 is depicted as being located external to the development management system 120, this is not meant to be limiting. For example, not shown, the structure data store 160 can be located internal to the development management system 120.

The construction data store 170 may store construction data for one or more parcels, one or more neighborhoods or census tracts, and/or one or more geographic regions. For example, the construction data may indicate the cost of materials in a particular neighborhood or region, the cost of construction labor in a particular neighborhood or region, a timeframe by which certain structures or building components (e.g., foundation, electrical, plumbing, flooring, etc.) take to construct in a particular neighborhood or region, a timeframe by which it takes to obtain certain construction permits in a particular neighborhood or region, building codes in a particular neighborhood or region, business rules for a particular neighborhood or region that reference one or more building codes, environmental and/or local site work requirements in a particular neighborhood or region, and/or the like. While the construction data store 170 is depicted as being located external to the development management system 120, this is not meant to be limiting. For example, not shown, the construction data store 170 can be located internal to the development management system 120.

The neighborhood data store 180 may store neighborhood data for one or more neighborhoods or census tracts in one or more geographic regions. For example, the neighborhood data may include statistics on home sales in the neighborhood (e.g., average home price, median home price, days a home is listed before being sold, average discount between list price and sales price, etc.), statistics on rents in the neighborhood (e.g., average rents for a 1 bedroom apartment, average rents for a 2 bedroom apartment, average rents for a 3 bedroom apartment, average rents for a house, etc.), statistics on time periods that listed parcels in the neighborhood are on the market, statistics on discounts for listed parcels in the neighborhood between list price and sales price, and/or the like. While the neighborhood data store 180 is depicted as being located external to the development management system 120, this is not meant to be limiting. For example, not shown, the neighborhood data store 180 can be located internal to the development management system 120.

The development management system 120 can be a computing system having memory storing computer-executable instructions and one or more hardware processors in communication with the memory, where the computer-executable instructions, when executed by the one or more hardware processors, cause the hardware processor(s) to identify a neighborhood or census tract and/or parcel at which to build a housing development and to generate and render a graphical representation of a housing development configuration. The development management system 120 may be a single computing device, or it may include multiple distinct computing devices, such as computer servers, logically or physically grouped together to collectively operate as a server system. The components of the development management system 120 can each be implemented in application-specific hardware (e.g., a server computing device with one or more ASICs) such that no software is necessary, or as a combination of hardware and software. In addition, the modules and components of the development management system 120 can be combined on one server computing device or separated individually or into groups on several server computing devices. In some embodiments, the development management system 120 may include additional or fewer components than illustrated in FIG. 1.

In some embodiments, the features and services provided by the development management system 120 may be implemented as web services consumable via the communication network 110. In further embodiments, the development management system 120 is provided by one more virtual machines implemented in a hosted computing environment. The hosted computing environment may include one or more rapidly provisioned and released computing resources, which computing resources may include computing, networking and/or storage devices. A hosted computing environment may also be referred to as a cloud computing environment.

The development management system 120 may include various modules, components, data stores, and/or the like to provide the housing development location selection and building configuration functionality described herein. For example, the development management system 120 may include an artificial intelligence (AI)-based neighborhood selector 121, an AI-based parcel selector 122, a building configurator 123, a user interface generator 124, and a development data store 125.

The AI-based neighborhood selector 121 can generate a ranking of the best neighborhoods or census tracts at which to build a housing development. For example, a user operating a user device 102 may access a unified portal hosted by the development management system 120. The unified portal may provide a user with various options, including an option to initiate the planning of a housing development. Via a user interface displayed on the user device 102 that depicts the unified portal, a user may be able to provide various development parameters that can be used, at least in part, to rank one or more neighborhoods or census tracts. For example, a development parameter can include a number of miles of distance (e.g., a radius) within which the development may be planned, a geographic boundary (e.g., address, neighborhood or census tract, city, state, nationwide, and/or custom (e.g., user-defined); where one or more boundaries can be selected; and where if multiple boundaries are selected, the development management system 120 can produce a logical grouping of the selected boundaries so that there is a clear parent/child relationship between the selected boundaries (e.g., a child spatial boundary may be wholly contained within a parent spatial boundary) to ensure integrity of data displayed within the user interface and artificial intelligence model results) within which the development may be planned, a spatial layer on which to evaluate neighborhood and/or parcel selections (e.g., boundaries of census tracts, boundaries of parcels, average market price per square foot of census tracts, average market price per square foot of parcels, quality land use of parcels, other land use of parcels, etc., where the selected spatial layer may be automatically enabled and data corresponding to the selected spatial layer may automatically be displayed within pane 312 described below in response to a neighborhood selection artificial intelligence model and/or a machine selection artificial intelligence model producing an output), a number of housing project phases (e.g., land acquisition, development, construction, disposition, etc.), a timeline for completion of each of the project phases, financing terms (e.g., type of financing, interest rate, loan term, down payment, fees, etc.), an identification of any permits that are known to be required, characteristics of a building to develop (e.g., acreage, square footage, type of development (e.g., new construction, remodel, etc.), project type (e.g., single-family residential, multi-family residential, commercial, industrial, etc.), a number of units to build, a style of home to build (e.g., ranch, single-story, multi-story, duplex, triplex, quadplex, etc.), a number of bedrooms, a number of bathrooms, etc.), an indication of a geographic region selected by the user, and/or the like. Upon selection of the development parameter(s), the user interface may automatically zoom a geographic map (e.g., the geographic map depicted in pane 312) to the location indicated by the development parameter(s).

Previously, the AI-based neighborhood selector 121 or another device external to the development management system 120 may have trained a neighborhood selection artificial intelligence model (e.g., a machine learning model) using a set of training data that includes census data, parcel data, zoning data, and/or neighborhood data for one or more neighborhoods, and/or one or more development parameters for one or more neighborhoods (e.g., an average timeline for completion of various project phases in the respective neighborhood, an identification of permits that are known to be required in the respective neighborhood, average characteristics of buildings developed in the respective neighborhood, etc.). For each neighborhood, the training data may be annotated to indicate a percentage of developments that were completed, a percentage of developments that failed to complete (either at all or on time), a percentage of developments that resulted in a profit, a percentage of developments that resulted in a loss, a percentage of developments that were purchased within a threshold period of time, and/or the like. The neighborhood selection artificial intelligence model may be trained to output a ranking of one or more neighborhoods based on provided input data, such as census data, parcel data, zoning data, neighborhood data, and/or one or more development parameters. In effect, the ranking that is output may indicate neighborhoods that are likely to have affordable houses in a location with a downward-trending crime rate, a downward-trending unemployment rate, and/or with a high quality of education.

Accordingly, before, during, and/or after the user provides one or more development parameters via the user interface, the AI-based neighborhood selector 121 can obtain, for a selected geographic region, census data from the census data store 130, parcel data from the parcel data store 140, zoning data from the zoning data store 150, and/or neighborhood data from the neighborhood data store 180. The AI-based neighborhood selector 121 can then apply the census data, the parcel data, the zoning data, the neighborhood data, and/or the one or more development parameters as an input to the trained neighborhood selection artificial intelligence model, which may result in the trained neighborhood selection artificial intelligence model outputting a ranking of one or more neighborhoods in the selected geographic region. In some embodiments, the user can indicate one or more input variables that are unimportant (e.g., indicate that certain census data or certain parcel data is unimportant). Indication of one or more input variables being unimportant may result in the neighborhood selection artificial intelligence model not weighting such input variables or applying a low weight to such input variables as compared to the weights applied to input variables that are not indicated as being unimportant when producing an output. The user interface may display the outputted rankings.

In some embodiments, after the trained neighborhood selection artificial intelligence model outputs the neighborhood ranking, the user interface may automatically highlight, annotate, zoom in on, or otherwise emphasize the highest ranked neighborhood. For example, prior to the trained neighborhood selection artificial intelligence model outputting the neighborhood ranking, the user interface may depict a geographic map showing different neighborhoods in a selected geographic region. After the trained neighborhood selection artificial intelligence model outputs the neighborhood rankings, the neighborhood rankings may be displayed in the user interface in one pane and/or a pane depicting the geographic map may automatically zoom in on or otherwise enlarge the graphical depiction of the highest ranked neighborhood. As described in greater detail below, the user interface can further show additional information within the geographic map, such as the boundaries of individual parcels in the highest ranked neighborhood, land use of individual parcels in the highest ranked neighborhood, demographic or financial data related to individual parcels in the highest ranked neighborhood, and/or the like.

In other embodiments, the user interface may not automatically modify an appearance of the geographic map after the trained neighborhood selection artificial intelligence model outputs the neighborhood ranking. Rather, the user interface may display the neighborhood ranking, but allow a user to explore information about different neighborhoods within the user interface before making a selection of one of the neighborhoods.

When a user toggles or hovers over the graphical representation of the neighborhood ranking in the user interface (e.g., in pane 310), the corresponding neighborhood depicted in a geographic map (e.g., in pane 312) may be updated to highlight, annotate, or otherwise emphasize the corresponding neighborhood and/or additional information regarding the corresponding neighborhood (e.g., census data, parcel data, neighborhood data, etc.) may be displayed in a pop-up window or tool-tip near the location of the neighborhood in the geographic map. Similarly, when a user toggles or hovers over a graphical representation of a neighborhood in the geographic map, the user interface may be updated to depict the ranking of the neighborhood, a percentage match to the provided development parameter(s), and/or the like.

The AI-based parcel selector 122 can function similar to the AI-based neighborhood selector 121 in that the AI-based parcel selector 122 can use artificial intelligence to identify a parcel at which to build a development. For example, the AI-based parcel selector 122 or an external device can train a parcel selection artificial intelligence model (e.g., a machine learning model) using a set of training data that includes parcel data, zoning data, structure data, construction data, and/or one or more development parameters for one or more parcels in a particular neighborhood or census tract. For each parcel, the training data may be annotated to indicate whether a development on the respective parcel was completed, whether a development on the respective parcel failed to complete (either at all or on time), whether a development on the respective parcel resulted in a profit, whether a development on the respective parcel resulted in a loss, whether a development on the respective parcel was purchased within a threshold period of time, and/or the like. The parcel selection artificial intelligence model may be trained to output an indication of a parcel on which to build a development based on provided input data.

Before, during, and/or after a neighborhood is selected, the AI-based parcel selector 122 can obtain, for the selected neighborhood, parcel data from the parcel data store 140, zoning data from the zoning data store 150, structure data from the structure data store 160, and/or construction data from the construction data store 170. The AI-based parcel selector 122 can then apply the parcel data, the zoning data, the structure data, the construction data, and/or the one or more development parameters as an input to the trained parcel selection artificial intelligence model, which may result in the trained parcel selection artificial intelligence model outputting an indication of a parcel in the selected neighborhood on which to build a development. In some embodiments, the user can indicate one or more input variables that are unimportant (e.g., indicate that certain parcel data or certain structure data is unimportant). Indication of one or more input variables being unimportant may result in the parcel selection artificial intelligence model not weighting such input variables or applying a low weight to such input variables as compared to the weights applied to input variables that are not indicated as being unimportant when producing an output. The user interface may display an indication of the identified parcel.

In some embodiments, after the trained parcel selection artificial intelligence model outputs the identified parcel, the user interface may automatically highlight, annotate, zoom in on, or otherwise emphasize the identified parcel. For example, prior to the trained parcel selection artificial intelligence model outputting the identified parcel, the user interface may depict a geographic map showing the selected neighborhood and boundaries of one or more parcels in the neighborhood. After the trained parcel selection artificial intelligence model outputs the identified parcel, a pane depicting the geographic map may automatically zoom in on or otherwise enlarge the graphical depiction of the identified parcel. As described in greater detail below, the user interface can further show additional information within the geographic map, such as land use of individual parcels in the neighborhood, demographic or financial data related to individual parcels in the neighborhood, an indication of whether a parcel is vacant, abandoned, blighted, pre-foreclosure, foreclosure, repossessed, etc., and/or the like.

In other embodiments, the user interface may not automatically modify an appearance of the geographic map after the trained parcel selection artificial intelligence model outputs an indication of a parcel. Rather, the user interface may display an indication of the identified parcel, but allow a user to explore information about different parcels within the selected neighborhood within the user interface before making a selection of one of the parcels.

In further embodiments, the AI-based parcel selector 122 can infer whether a parcel is vacant, abandoned, blighted, pre-foreclosure, foreclosure (e.g., government-sponsored entity (GSE) real estate owned (REO); banked REO; bank or non-bank serviced housing and urban developed (HUD) REO; federal housing administrator (FHA), veterans administration (VA), or rural housing service (RHS) REO; private label securities (PLS) REO, etc.), repossessed, etc. using parcel data such that such information can be depicted in the user interface. For example, the AI-based parcel selector 122 may determine that a parcel is vacant or abandoned if the parcel has a current private owner with valid contact information, has clear title, and/or there is evidence that the parcel is available for sale (as indicated by parcel data). The AI-based parcel selector 122 may determine that a parcel is GSE REO if the parcel has mortgage loans that were originated and serviced as Fannie Mae or Freddie Mac loans and there is clear title to the property owned by Fannie Mae or Freddie Mac, there is clear evidence that the parcel is in some stage of active pre-foreclosure sale, post-foreclosure auction, or GSE REO for sale, and there is evidence (from parcel data) that the property is available for sale. The AI-based parcel selector 122 may determine that a parcel is bank REO if the parcel has mortgage loans that were originated by the lender, there is clear title to the property owned by the bank, there is clear evidence that the parcel is in some stage of active pre-foreclosure sale, post-foreclosure auction, or bank REO for sale, and there is evidence (from parcel data that the property is available for sale). The AI-based parcel selector 122 may determine that a parcel is bank or non-bank serviced HUD REO if the parcel has mortgage loans that were originated service as an FHA, VA, or RHS loan, there is clear title to the property owned by the bank or non-bank services, there is clear evidence that the parcel is in some stage of active pre-foreclosure sale, post-foreclosure auction, or bank or non-bank service REO, and there is evidence (from parcel data) that the property is available for sale. The AI-based parcel selector 122 may determine that a parcel is FHA, VA, or RHS REO if the parcel has mortgage loans that were originated and services as an FHA, VA, or RHS loan, there is clear to title to the property to HUD, there is clear evidence that the loan made it all the way through conveyance/claim, but failed REO auction, and there is clear evidence (from parcel data) that the property is available for sale. The AI-based parcel selector 122 may determine that a parcel is PLS REO if the parcel has mortgage loans that were originated and serviced as a PLS, there is clear title to property owned by the PLS trust, there is clear evidence that the parcel is in some stage of active pre-foreclosure sale, post-foreclosure auction, or PLS trust REO, and there is evidence (from parcel data) that the property is available for sale. When the user selects, via a user interface, a graphical representation of a parcel inferred to be vacant, abandoned, blighted, pre-foreclosure, foreclosure, repossessed, etc., then the user interface may depict sales price and/or contact information for the owner or lister.

The building configurator 123 can determine a configuration for a building to develop on the selected parcel and generate a two-dimensional or three-dimensional model of the determined configuration. For example, the building configurator 123 can obtain, for the selected neighborhood and/or parcel, parcel data from the parcel data store 140, neighborhood data from the neighborhood data store 180, structure data from the structure data store 160, and/or construction data from the construction data store 170 to perform a market demand analysis of comparable properties or parcels in the selected neighborhood or within a certain, user-defined search radius. Optionally, the building configurator 123 can analyze comparable properties that match search criteria provided by a user via the user device 102, such as a search radius, home style, number of bedrooms, number of full bathrooms, total living area square footage, year built, sales price or monthly rental price range, etc. As an illustrative example, the building configurator 123 can process the structure data for different parcels in the selected neighborhood to identify the types and/or quality of materials, fixtures, finishings, etc. typically used to construct buildings of the same type as requested by the user in the selected neighborhood, can process the structure data for different parcels in the selected neighborhood to identify the typical number of bedrooms, bathrooms, and/or floors present therein, can process the construction data for different parcels in the neighborhood to identify building codes to construct buildings of the same type as requested by the user in the selected neighborhood and/or building permits that may be required (where the building permits that may be required may be indicated in the construction data itself or may be derived from user-configured business rules indicated in the construction data itself, where the user-configured business rules, when encountered, may cause the building configurator 123 to retrieve information for one or more building permits referenced by the building rules via the construction data), can process the construction data for different parcels in the neighborhood to identify environmental and/or local site work requirements, can process the construction data to identify the cost of labor for different parcels in the neighborhood, can process the parcel data to identify the quality land use of one or more parcels in the neighborhood, can process the neighborhood data to process statistics on home sales and/or rents in the neighborhood (including on a parcel by parcel basis), can process the neighborhood data to process statistics on time periods that listed parcels in the neighborhood are on the market, can process the neighborhood data to process statistics on discounts for listed parcels in the neighborhood between list price and sales price, and/or the like. Based on processing the data corresponding to the comparable properties or parcels in the selected neighborhood or search radius that optionally satisfies search criteria provided by a user, the building configurator 123 can generate a building configuration that meets building codes in the selected neighborhood and/or that reduces construction costs while maximizing the likelihood that the constructed building would be sold or rented. The building configuration may include a layout of the building, such as a layout of one or more floors of the building. The layout can include an indication of a location of one or more rooms, bathrooms, closets, garages, etc., a dimension of one or more rooms, bathrooms, closets, garages, etc., a location and/or dimension of one or more materials, fixtures, finishings, appliances, etc., a quality of materials, a type of home style and/or design features (e.g., front porch, balcony, outdoor deck, bonus room, fixtures, finishings, appliances, cabinetry, flooring, etc.), total living area square footage, and/or the like.

Optionally, the user interface may depict a list of properties or parcels (e.g., optionally depicting one or more additional information identifying the properties or parcels, such as images of the properties or parcels, addresses of the properties or parcels, features or characteristics of the properties or parcels, listing price of the properties or parcels, automated valuation of the properties or parcels, etc.) that satisfy the user-provided search criteria before, during, and/or after the building configurator 123 generates the building configuration. Optionally, the user may be able to select one or more properties or parcels from the list, and the building configurator 123 can use the characteristics of the selected properties or parcels (e.g., mean original listing price, mean final sales price, mean days listed on market, mean number of times listed and de-listed, number of bedrooms, number of bathrooms, room size, bathroom size, closet size, layout of a first floor, layout of a basement, layout of an attic, etc.) to, at least in part, generate the building configuration (e.g., the building configurator 123 may generate the building configuration solely based on some or all of the selected properties or parcels, partly based on some or all of the selected properties or parcels, or not at all based on some or all of the selected properties or parcels).

Optionally, the user can provide one or more building or construction characteristics that may affect the building layout, such as the number of bedrooms, number of bathrooms, total living area square footage, the dimensions (or minimum or maximum dimensions) of a bedroom, the number of days for individual phases of the project, one or more building permits that apply (e.g., which may be selected via a drop-down menu in the user interface), a desired percentage target rate of return for the project, home style, materials to be used in construction, quality of materials to be used in construction, home design features (e.g., front porch, outdoor deck, balcony, etc.), etc. The building configurator 123 can generate the building configuration in accordance with the user-provided building characteristics, one or more properties or parcels selected from the list, and/or the processing of some or all of the data described above.

Optionally, the user via the user interface can indicate whether a selected parcel should be subdivided into one or more new parcels. For example, the user can indicate the number of new parcels and/or the dimensions (e.g., length, width, individual boundaries (e.g., in latitude/longitude coordinates) for irregularly-shaped parcels, etc.) for each new parcel. As one example, the user interface may present a geographic map to the user that depicts the parcel. Via the user interface, the user may be able to draw boundaries that define one or more subdivided parcels, with the user interface constraining a user's ability to draw boundaries such that the boundaries drawn conform to zoning regulation(s) applied to the selected parcel (e.g., the building configurator 123 can use zoning data from the zoning data store 150 to constraint the boundary drawing ability). The building configurator 123 can validate the provided dimensions to ensure that the total square footage or acreage of the subdivided parcels do not exceed the total square footage or acreage of the selected parcel prior to subdivision and, if validated, can generate a building configuration for some or all of the subdivided parcels in accordance with some or all of the techniques described above. If the dimensions cannot be validated, the building configurator 123 may prompt the user via the user interface to redraw or otherwise provide new dimensions for the subdivided parcels.

As one example, the building configurator 123 can generate the building configuration at least in part by retrieving information for one or more properties or parcels selected by the user from the list (which may indicate properties or parcels that the user found to be most representative of the desired design configuration), holding constant some or all of the building or construction characteristics provided by the user, run a cost calculation for a home style selected by the user while aligning the building or construction characteristics of the building to one or more of the properties or parcels selected from the list, retrieving zoning regulations (e.g., zoning code, land use code, home style, etc.), constraining dimensions of the building to satisfy requirements defined by the zoning regulations, re-calculating a cost for the home style given the constrained dimensions, determining if any building permits are required (e.g., based on information provided by the user, based on zoning data, based on construction data, etc.) and/or if any subdivision permits are required (e.g., if a parcel is being subdivided), determining a median number of days to obtain each applicable permit and corresponding fees based on zoning regulations for other parcels in the neighborhood, calculating land acquisition and/or hard construction costs (e.g., labor, equipment, materials) for the building (or buildings if the parcel is subdivided), calculating soft construction costs (e.g., architecture costs, engineering costs, interest carrying costs, property taxes, building permit fees, etc.), comparing the mean number of days for obtaining the applicable permits to the number of days for a land acquisition phase and calculating any additional costs incurred (e.g., interest carrying costs, property taxes) as a result of the mean number of days for obtaining the applicable permits exceeding the number of days for the land acquisition phase, determining the typical home price discount in the neighborhood, and/or calculating a profit or loss, a net present value, and/or a rate of return for the housing development based on the home price discount, the hard and soft construction costs, the total project timeline, and a target rate of return. If the net present value is negative, the building configurator 123 may hold the building or construction characteristics constant, but iterate through some or every combination and permutation of construction materials and quality of materials (with the priority in which construction materials and/or quality of materials is iterated being user-defined, based on materials and/or quality of materials used in other parcels in the selected neighborhood, etc.) and re-runs some or all of the operations described above until the housing development has a positive net present value. If or once the net present value is positive, the building configurator 123 may hold the building or construction characteristics constant, but iterate through some or every combination and permutation of design features that can be added to the building (e.g., front porch, outdoor deck, extra closets, balcony, finished basement, pool, tennis court, larger garage, office space, etc.) (with the priority in which design features is iterated being user-defined, based on design features found in structure(s) on other parcels in the selected neighborhood, etc.) and re-runs some or all of the operations described above until the housing development has a net present value of 0 or a net present value that is positive and within a threshold value (e.g., 1, 2, 3, etc.) of 0.

The building configuration may be a data structure that includes data indicating the building layout and/or building and/or construction characteristics of the building. The building configurator 123 can then parse the data structure to generate a two-dimensional or three-dimensional model that, when rendered, visually depicts the building configuration. For example, the two-dimensional or three-dimensional model, when rendered, may visually depict the layout of one or more floors, including the contents (e.g., fixtures, finishings, appliances, materials, quality of materials, electrical wiring, plumbing, etc.) of one or more rooms in one or more floors. As described below, the user interface may depict the two-dimensional or three-dimensional model, and may allow a user to move, pan, rotate, zoom in on, zoom out on, remove or add layers of (e.g., hide or make visible floors, hide or make visible fixtures, hide or make visible appliances, hide or make visible finishings, hide or make visible materials used, hide or make visible electrical wiring, hide or make visible plumbing, etc.), and/or modify the configuration (e.g., modify the size, layout, location, etc. of a room, a bathroom, a floor, etc.) of the model.

The building configurator 123 may not only cause a user interface to depict the two-dimensional or three-dimensional model, but may also cause the user interface to depict a summary view of profit and/or loss, net present value, and/or rate of return (e.g., a summary of the initial analysis before any iteration is performed, the net present value of the positive-to-optimized building configuration, the net present value of the negative-to-optimized building configuration, subsidized analysis, market rate analysis, and/or the like), a detailed view that allows a user to drill down into each individual property and/or building (where there may be multiple if the parcel is subdivided) to view a detailed view of the information presented in the summary view (e.g., full breakdown of labor, equipment, materials, and/or soft costs, including a display of the amount of money attributable to project slippage resulting from building permit delays), and/or a side-by-side comparison in which a user can select one or more building configurations to compare with the generated building configuration. For example, the summary view, the detailed view, and/or the side-by-side comparison can be displayed concurrently (e.g., fully overlapping, partially overlapping, or not overlapping at all) or individually in the user interface. The side-by-side comparison may include a textual comparison of the selected building configuration(s) and the generated building configuration (e.g., a comparison of costs, design features, etc.) and/or a comparison of interactive two-dimensional or three-dimensional models of the selected building configuration(s) and the generated building configuration.

In further embodiments, the building configurator 123 can generate the building configuration using artificial intelligence. For example, the building configurator 123 can train a building configurator artificial intelligence model (e.g., a machine learning model) to output a building configuration in response to receiving as an input building or construction characteristics selected by a user, an indication of one or more properties or parcels selected by the user from the list that satisfies the user-provided search criteria, and/or any other data described above as factoring in to the building configuration generated by the building configurator 123. In particular, the building configurator 123 can train the building configurator artificial intelligence model using training data that includes any of the data that can be applied as an input to the model as described above (e.g., building or construction characteristics provided by a user, final building or construction characteristics of a housing development, project phase timelines, financial terms, etc.) associated with one or more completed housing developments, annotated to indicate the net present value of the respective housing developments. In response a user attempting to plan a new housing development, the building configurator 123 can apply some or all of the input data described above as an input to the trained building configurator artificial intelligence model, which may cause the trained building configurator artificial intelligence model to output a generated building configuration or a two-dimensional or three-dimensional model that the trained building configurator artificial intelligence model derives after first generating internally a building configuration.

AI-based neighborhood selector 121 and/or the AI-based parcel selector 122 can store the development parameter(s) provided by a user, the identified neighborhood, and/or the identified parcel in the development data store 125 in an entry associated with a particular project. Similarly, the building configurator 123 can store the building configuration and/or the two-dimensional or three-dimensional model in the development data store 125 in an entry associated with a particular project. Thus, the development data store 125 may store data for various projects, such as housing projects that are being planned, are in progress, and/or are completed.

The user interface generator 124 can generate user interface data and transmit the user interface data to the user device 102. The user interface data, when processed by the user device 102, may cause the user device 102 to render and display a user interface, such as a user interface that has some or all of the features described herein. For example, the user interface generator 124 can generate user interface data that, when processed, causes the user device 102 to display an interactive user interface that depicts various neighborhoods, parcels, and/or two-dimensional or three-dimensional models of building configurations.

Various example user devices 102 are shown in FIG. 1, including a desktop computer, laptop, and a mobile phone, each provided by way of illustration. In general, the user devices 102 can be any computing device such as a desktop, laptop or tablet computer, personal computer, wearable computer, server, personal digital assistant (PDA), hybrid PDA/mobile phone, mobile phone, electronic book reader, set-top box, voice command device, camera, digital media player, and the like. A user device 102 may execute an application (e.g., a browser, a stand-alone application, etc.) that allows a user, such as a developer or another stakeholder involved in a housing development (e.g., a district commissioner, a member of a housing agency, a land development official, etc.) to develop a housing development plan, provide data to use in developing the plan (e.g., census data, parcel data, zoning data, structure data, construction data, and/or neighborhood data)—which can include appending the provided data to a particular plan being developed, monitor the progress of a housing development plan, provide input on the development of a housing development plan (e.g., submit feedback or comments on neighborhood selections, parcel selections, building configuration selections, etc.), request input on the development of a housing development plan, request missing data (e.g., zoning data) from a developer or stakeholder, and/or make changes to a housing development plan. If a user provides data via the user device 102, the user device 102 may store the data in the appropriate data store so that the data is available for use by the development management system 120 in a manner as described herein. As one example, a developer can use the user device 102 to interact with the development management system 120 and request missing data. In response, the development management system 120 may identify the stakeholder that can provide the missing data (e.g., the development management system 120 may store internally a mapping between user devices 102 operated by stakeholders and data that such stakeholders are in a position to provide) and send a request to the user device 102 operated by the stakeholder requesting the requested data. The stakeholder can use the user device 102 to provide the requested data (e.g., either directly or by providing information indicating a location at which the requested data can be found) to the development management system 120, and the development management system 120 can then notify the developer via the developer's user device 102 that the missing data is now available. In some embodiments, data provided by a user, such as a stakeholder, may be access-controlled such that the data can be read by the development management system 120 and any developer planning a development to which the data is relevant, but only the user himself or herself can actually delete or modify the data.

The network 110 may include any wired network, wireless network, or combination thereof. For example, the network 110 may be a personal area network, local area network, wide area network, over-the-air broadcast network (e.g., for radio or television), cable network, satellite network, cellular telephone network, or combination thereof. As a further example, the network 110 may be a publicly accessible network of linked networks, possibly operated by various distinct parties, such as the Internet. In some embodiments, the network 110 may be a private or semi-private network, such as a corporate or university intranet. The network 110 may include one or more wireless networks, such as a Global System for Mobile Communications (GSM) network, a Code Division Multiple Access (CDMA) network, a Long Term Evolution (LTE) network, or any other type of wireless network. The network 110 can use protocols and components for communicating via the Internet or any of the other aforementioned types of networks. For example, the protocols used by the network 110 may include Hypertext Transfer Protocol (HTTP), HTTP Secure (HTTPS), Message Queue Telemetry Transport (MQTT), Constrained Application Protocol (CoAP), and the like. Protocols and components for communicating via the Internet or any of the other aforementioned types of communication networks are well known to those skilled in the art and, thus, are not described in more detail herein.

Example Block Diagram for Planning a Housing Development

Figure 2:
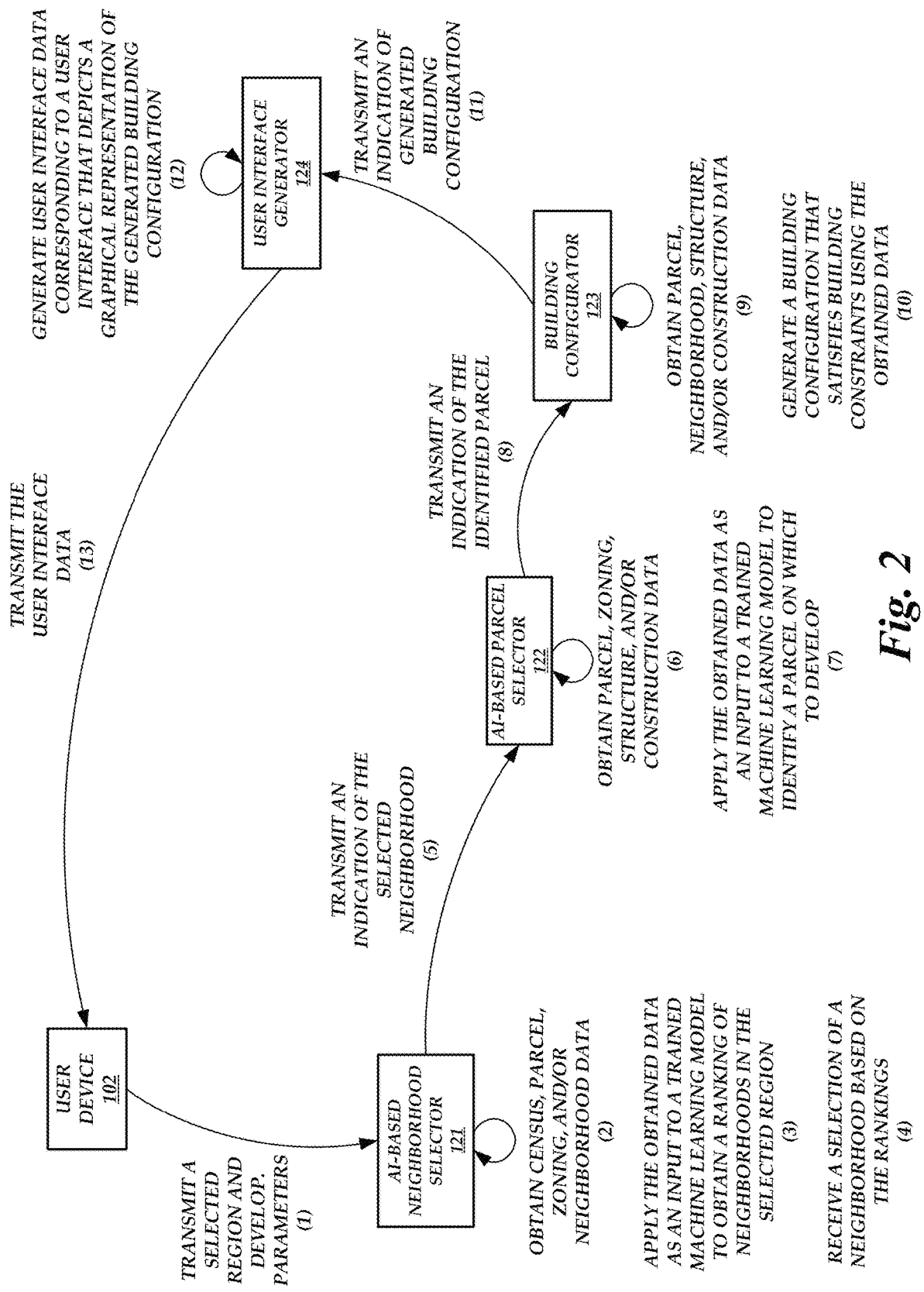
FIG. 2 is a flow diagram illustrating the operations performed by the components of the operating environment of FIG. 1 to plan a housing development.

FIG. 2 is a flow diagram illustrating the operations performed by the components of the operating environment 100 of FIG. 1 to plan a housing development. As illustrated in FIG. 2, a user device 102 can transmit a selection region and one or more development parameters to the AI-based neighborhood selector 121 at (1). For example, the region and the development parameter(s) may be selected via a user interface.

The AI-based neighborhood selector 121 can obtain census, parcel, zoning, and/or neighborhood data at (2). For example, the AI-based neighborhood selector 121 can obtain such data for the selected region. The AI-based neighborhood selector 121 can then apply the obtained data and/or the development parameter(s) as an input to a trained machine learning model (e.g., a neighborhood selection machine learning model) to obtain a ranking of neighborhoods in the selected region at (3). In some embodiments, the user interface may automatically select the highest ranked neighborhood (or the second-highest ranked neighborhood, the third-highest ranked neighborhood, etc.) and modify an appearance of a geographic map to focus on (e.g., zoom in on, center a map on, provide more detail on, etc.) the highest ranked neighborhood. In other embodiments, the AI-based neighborhood selector 121 can receive a selection of a neighborhood based on the rankings at (4) (e.g., via a user making a selection via the user interface). The AI-based neighborhood selector 121 can then transmit an indication of the selected neighborhood to the AI-based parcel selector 122 at (5).

The AI-based parcel selector 122 can obtain parcel, zoning, structure, and/or construction data at (6). For example, the AI-based parcel selector 122 can obtain such data for the selected neighborhood. The AI-based parcel selector 122 can then apply the obtained data and/or the development parameter(s) as an input to a trained machine learning model (e.g., a parcel selection machine learning model) to identify a parcel on which to develop a housing project at (7). In some embodiments, the user interface may automatically select the identified parcel and modify an appearance of a geographic map to focus on (e.g., zoom in on, center a map on, provide more detail on, etc.) the selected parcel. In other embodiments, the AI-based parcel selector 122 can receive, via the user interface, a selection of a parcel in response to the user interface depicting the output of the trained machine learning model. The AI-based parcel selector 122 can then transmit an indication of the identified parcel to the building configurator 123 at (8).

The building configurator 123 can obtain parcel, neighborhood, structure, and/or construction data at (9). For example, the building configurator 123 can obtain such data for the selected parcel. The building configurator 123 can then generate a building configuration that satisfies building constraints (e.g., complies with building codes of the selected neighborhood and/or parcel) using the obtained data at (10). The building configurator 123 can transmit an indication of the generated building configuration to the user interface generator 124 at (11). For example, the indication of the generated building configuration can include the building configuration (e.g., a data structure) and/or a two-dimensional or three-dimensional model derived from parsing the building configuration.

The user interface generator 124 can generate user interface data corresponding to a user interface that depicts a graphical representation of the generated building configuration at (12). For example, the user interface data, when processed by the user device 102, may cause the user device 102 to render and display a user interface depicting a two-dimensional or three-dimensional model of a configured building that the development management system 120 recommends be built in the selected neighborhood on the selected parcel. The user interface generator 124 can then transmit the user interface data to the user device 102 at (13).

Example User Interfaces

FIGS. 3-10 illustrate an example user interface 300 that may depict various features to enable to a user to plan a housing development. The user interface 300 may be displayed by a user device 102 in response to receiving user interface data from the development management system 120, where the user interface data, when processed by the user device 102, causes the user device 102 to render and display the user interface 300. As a user makes selections or otherwise interacts with the user interface 300, the development management system 120 may transmit to the user device 102 updated user interface data that, when processed, causes the user device 102 render and display updated versions of the user interface 300.

Figure 3:
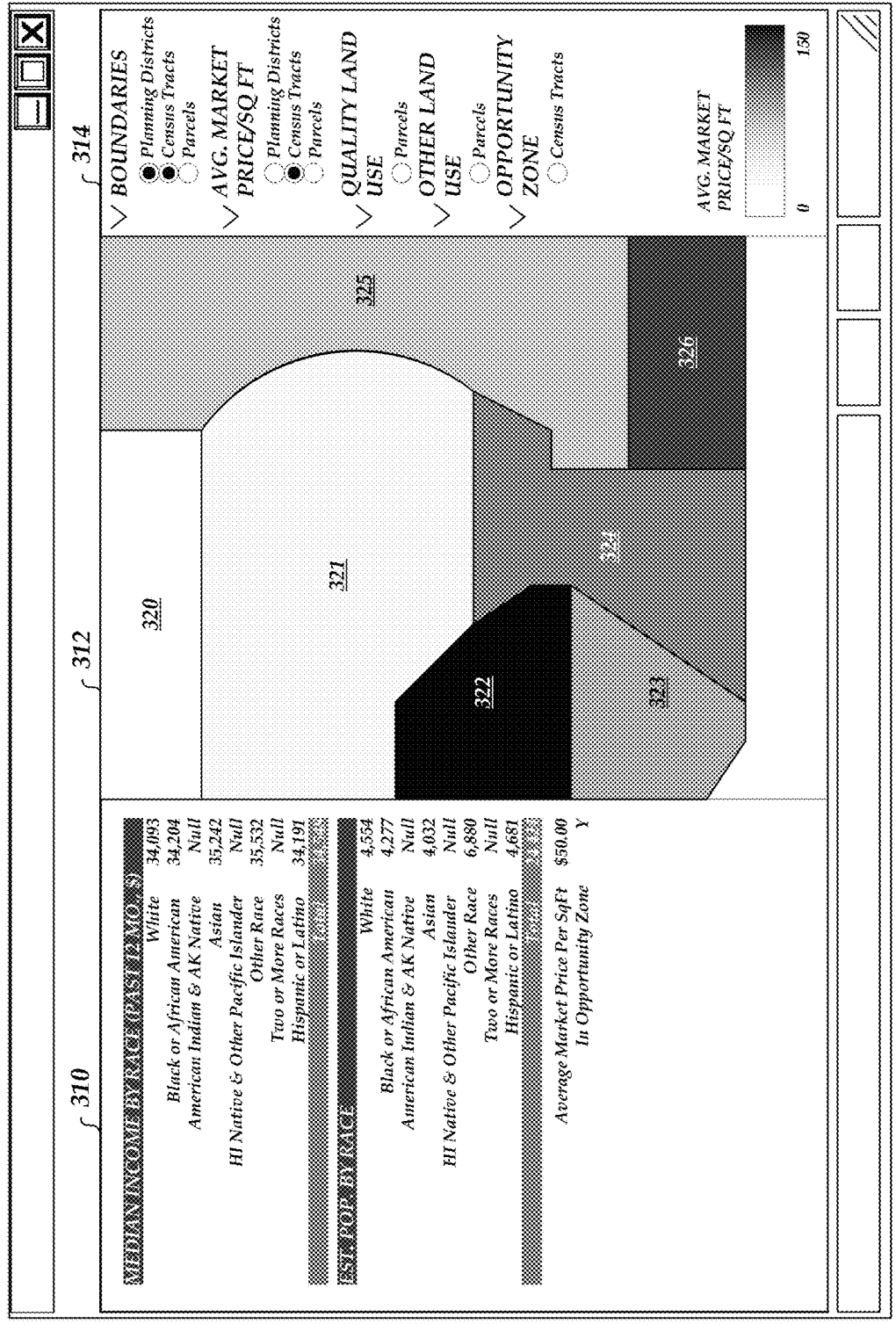
FIGS. 3-10 illustrate an example user interface that may depict various features to enable to a user to plan a housing development.

As illustrated in FIG. 3, the user interface 300 includes panes 310, 312, and 314. The pane 312 depicts a geographic map showing the boundaries of different neighborhoods or census tracts 320-326 with a particular geographic region. At this stage, a user may be trying to identify a location at which to develop a housing project and/or a building configuration for the housing project, but has not yet selected a region, neighborhood, parcel, or building configuration. While the pane 312 depicts the neighborhoods 320-326 in one geographic region, the user may not yet have selected the geographic region. Rather, the user may have zoomed in to a particular geographic region for browsing purposes.

The pane 310 may depict census data for the geographic region(s) shown in the pane 312. For example, the pane 310 may be updated to depict the census data shown when a user selects or zooms in on a particular geographic region in the pane 312. If the user zooms out and pans to another geographic region, then the pane 310 may automatically update to show the census data for the other geographic region.

The appearance of the graphical representations of the neighborhoods 320-326 depicted in the pane 312 may be shaded, colors, marked, or otherwise modified to indicate various information. For example, the pane 314 may allow a user to select to view or not view boundaries for planning districts (e.g., geographic regions), census tracts (e.g., neighborhoods), and/or parcels; the average market price per square foot for planning districts, census tracts, and/or parcels; the quality land use for parcels; the other land use for parcels, and/or the opportunity zone of census tracts. In addition, not shown, the pane 314 may allow a user to select to view or not view other information for census tracts and/or parcels as layers that overlay upon the geographic map in the pane 312, such as historical home value trends and/or forecasts, historical rent price trends, vacancy trends, road data (e.g., rendering of public and/or private roads), vacancy data (e.g., shading, coloring, or other markings indicating whether a parcel is vacant, abandoned, blighted, pre-foreclosure, foreclosure, repossessed, etc.), custom boundaries (e.g., as uploaded by a user), custom parcels (e.g., custom analytics data for one or more parcels), parcel title owner and/or contact information, zoning code boundaries, hazard data (e.g., shading, coloring, or other markings indicating whether a parcel or neighborhood is susceptible to a hazard, such as flooding, hail, tornadoes, hurricanes, lightning strikes, earthquakes, mudslides, wildfires, etc.), historical population growth, forecasted population growth, historical change in number of renters, historical change in number of owner occupants, historical mean rental price, historical mean home sales price, historical mean monthly mortgage payment (e.g., principal, interest, taxes, and/or insurance), current mean rental price, current mean home sales price, current mean monthly mortgage statement, median number of bedrooms, median number of bathrooms, median total living area square footage, quartile breakdown (total units and/or percentage) of number of full bedrooms, quartile breakdown (total properties and/or percentage share) of number of full bathrooms, quartile breakdown (total properties and/or percentage share) of median living area square footage, breakdown of the percentage share of the top N home styles for all properties depicted, total number of properties depicted, and/or the like. As illustrated in FIG. 3, the user has selected to view boundaries for planning districts and census tracts and has selected to view the average market price per square foot for census tracts. As a result of these selections, the pane 312 may automatically update to modify an appearance of one or more of the graphical representations of the neighborhoods 320-326 to convey the average market price per square foot for individual neighborhoods 320-326. As indicated in the legend near the bottom of the pane 314, a darker shading may indicate that the average market price per square foot is near the high end of price per square foot (e.g., $150 per square foot) and a lighter shade may indicate that the average market price per square foot is near the lower end of price per square foot (e.g., $0 per square foot). If the user had instead selected to view the boundaries of individual parcels in census tracts and to view the average market price per square foot of individual parcels, then the pane 312 may automatically update to show the boundaries of individual parcels in each of the neighborhoods 320-326 and/or to shade the graphical representations of the individual parcels to indicate the average market price per square foot of the respective parcel.

Figure 4:
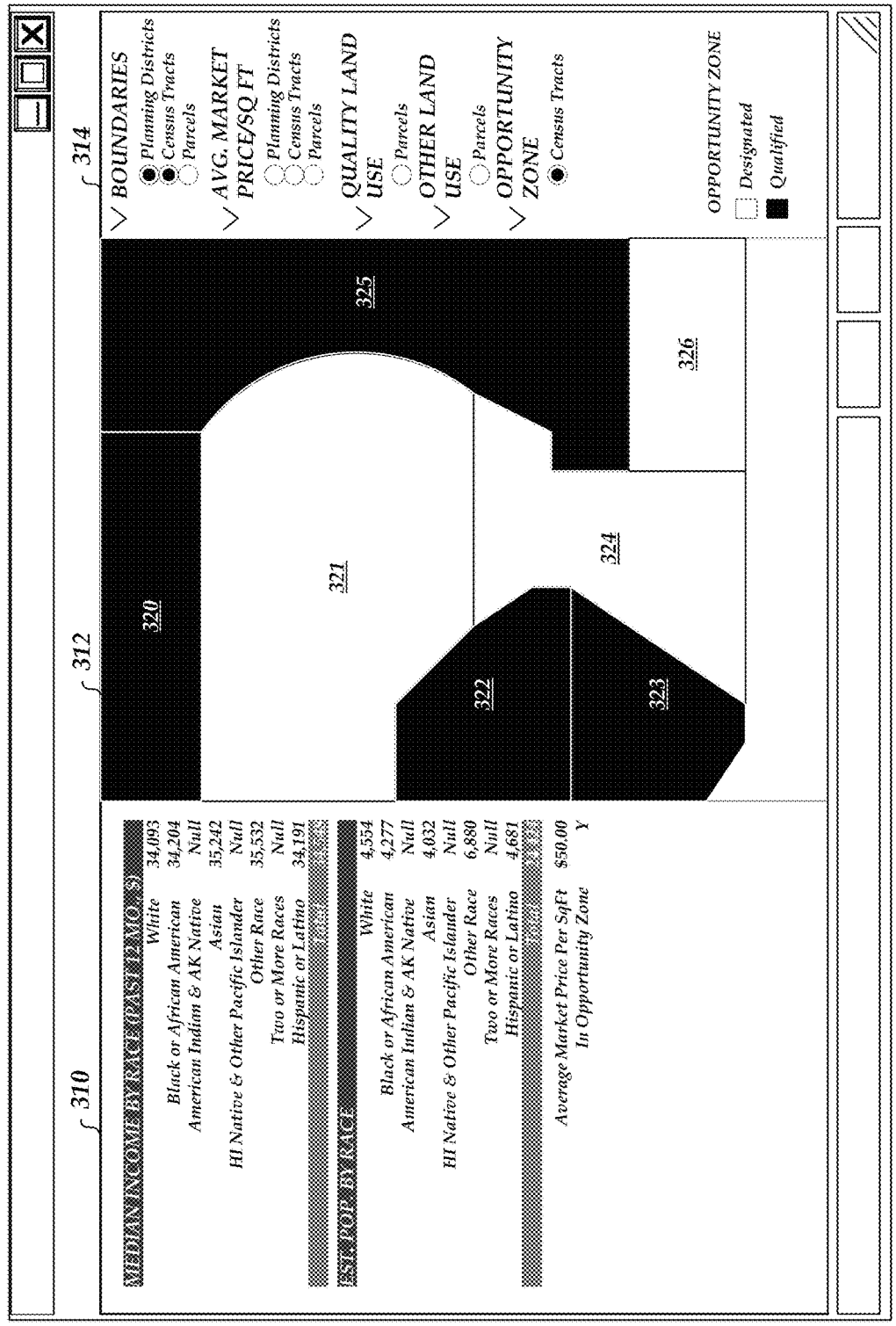

As illustrated in FIG. 4, the user has modified the selections made in the pane 314. For example, the user has now selected to not view the average market price per square foot of census tracts and to view information indicating the type of opportunity zone in which each census tract falls. As a result, the pane 312 automatically updates to change the appearance of the graphical representations of the neighborhoods 320-326 such that the graphical representations are shaded to indicate whether the corresponding neighborhood 320-326 is a designated opportunity zone or a qualified opportunity zone (per the new legend depicted near the bottom of the pane 314).

In some embodiments, the boundaries, the average market price per square foot, the quality land use, the other land use, and/or the opportunity zone data may be represented as different layers that can overlay over a geographic map. Thus, selecting one or more options via the pane 314 may cause the pane 312 to display one or more corresponding layers over a geographic map. Each layer may be at least partially transparent such that information represented by multiple layers can be depicted concurrently within the pane 312. For example, data representing the average market price per square foot of individual census tracts and data representing the boundaries of individual census tracts can be depicted and be visible concurrently and may overlay the geographic map such that at least some information depicted in the geographic map can be viewed concurrently with the other data as well (e.g., an indication of the location of roads, buildings, etc. may be visible in addition to the average market price per square foot data and the boundary data). Accordingly, multiple sets of data can be displayed in the user interface 300 in a single view.

Thus, FIGS. 3 and 4 illustrate how the user interface 300 can display different types of data (e.g., census data, parcel data, neighborhood data, etc.) within a single view, which provides an improved user interface as it reduces the number of navigational steps a user may perform to view the same information. For example, even though the user interface 300 may have a finite size given screen and/or display limitations, the user interface 300 can display the data relevant to the user in the above-the-fold portion of the user interface 300 and without requiring a user to scroll vertically and/or horizontally and/or to open new pages, windows, and/or tabs to view the data.

Figure 5:
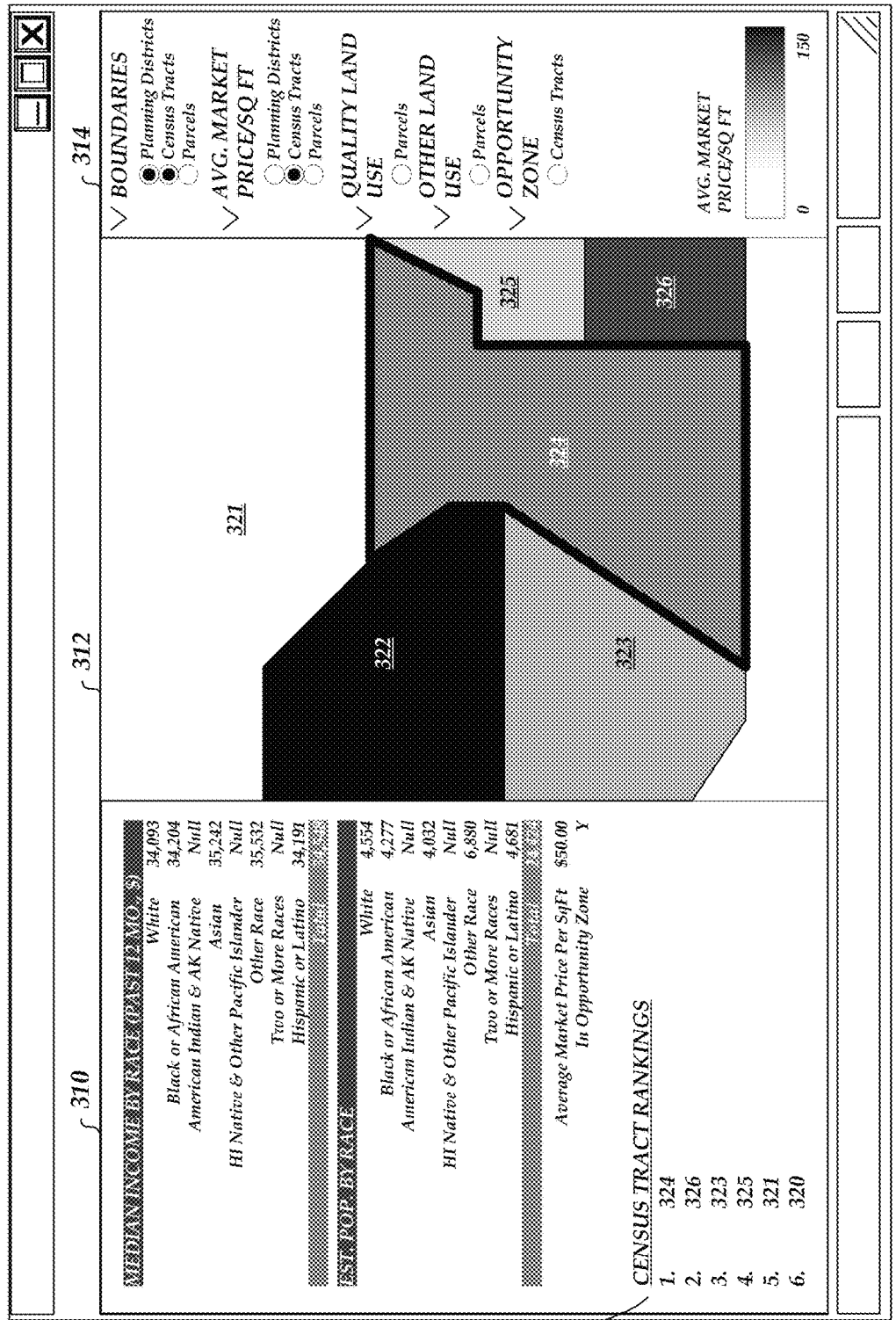

As illustrated in FIG. 5, a user may have selected a geographic region via the user interface 300. In making the selection, the user may have provided one or more development parameters via the user interface 300 as well (not shown). For example, the user may have selected the geographic region after viewing census data, average market price per square foot, quality land use, other land user, and/or opportunity zone information using the panes 310, 312, and 314. As a result, the AI-based neighborhood selector 121 may automatically obtain the data described above and apply the obtained data and/or the development parameter(s) as an input to a trained neighborhood selection artificial intelligence model. The trained neighborhood selection artificial intelligence model may output a ranking of neighborhoods or census tracts, and the user interface 300 may display corresponding rankings 530 in the pane 310. In further embodiments, the rankings 530 may not only depict the rank of one or more neighborhoods, but also a probability match or percentage indicating how close the features of the respective neighborhood match the provided development parameter(s).

In some embodiments, the pane 312 may then automatically zoom in, highlight, or otherwise focus on the highest ranked neighborhood, which in this case is neighborhood 324. Optionally, the pane 312 may shade, make more transparent, or hide the graphical representations of the other neighborhoods 320-323 and 325-326. At this stage, the user interface 300 may treat the highest ranked neighborhood (e.g., the neighborhood 324) as being selected and may further update the content depicted therein to allow a parcel to be selected within the neighborhood 324 (as described below). In other embodiments, the pane 312 may not automatically change an appearance of the graphical map or select the highest ranked neighborhood. Rather, the user interface 300 may allow the user to view the rankings 530 and to browse the various neighborhoods 320-326 before making a selection.

When a user toggles or hovers over the rankings 530, the graphical representation of the corresponding neighborhood in the pane 312 may be updated automatically to highlight, annotate, or otherwise emphasize the corresponding neighborhood and/or additional information regarding the corresponding neighborhood (e.g., census data, parcel data, neighborhood data, etc.) may be displayed in a pop-up window or tool-tip near the location of the graphical representation of the corresponding neighborhood in the pane 312 (e.g., overlapping, partially overlapping, or being placed adjacent to the graphical representation of the neighborhood). Similarly, when a user toggles or hovers over a graphical representation of a neighborhood in the pane 312, the pane 312 may be updated automatically to depict the ranking of the neighborhood, a percentage match to the provided development parameter(s), and/or the like in a pop-up window or tool-tip (e.g., overlapping, partially overlapping, or being placed adjacent to the graphical representation of the neighborhood).

Figure 6:
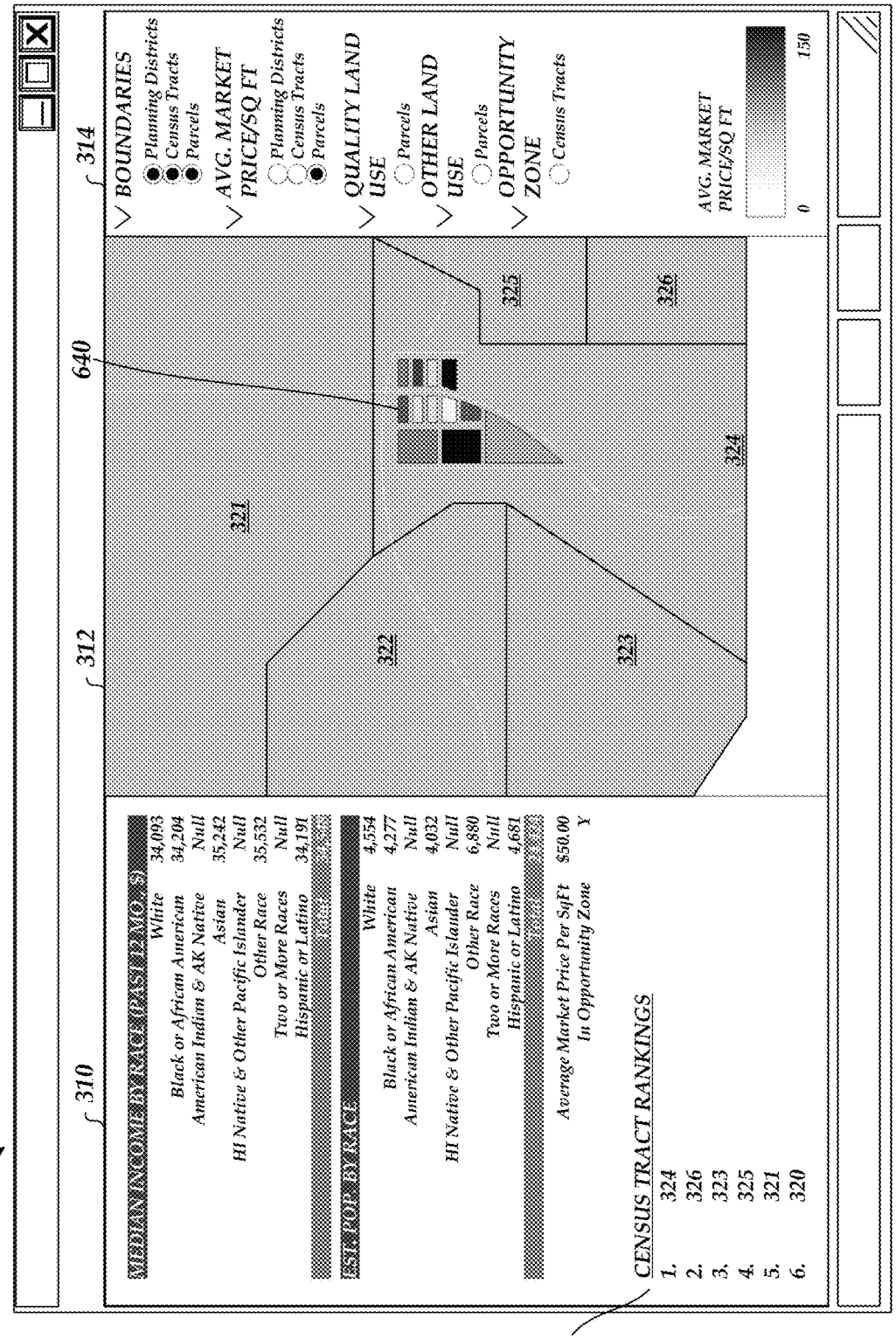

As illustrated in FIG. 6, the highest ranked neighborhood (e.g., the neighborhood 324) has been automatically selected based on the trained neighborhood selection artificial intelligence model output, has been selected by a user via the user interface 300, or is being viewed prior to the neighborhood 324 being selected. For example, the user interface 300 may automatically select the option to view parcel boundaries and/or the average market price per square foot of parcels in the pane 314 in response to the trained neighborhood selection artificial intelligence model outputting the rankings 530 and/or development parameter(s) previously being received indicating that the parcel boundaries and/or average market price per square foot of parcels spatial layers are to be selected, which may cause the pane 312 to automatically update to show the boundaries of individual parcels (such as parcel 640 among others) and/or to modify an appearance of the graphical representations of the individual parcels (such as the parcel 640 among others) to reflect the average market price per square foot of the individual parcels (or the quality land use of the individual parcels or the other land use of the individual parcels). In other words, once the user selects a geographic region and provides one or more development parameters via the user interface 300, the development management system 120 may automatically identify a neighborhood in which to develop a housing project and cause the user interface 300 to update automatically to show an indication of the rankings 530, the selected neighborhood 324 within a geographic map, and content associated with the selected neighborhood 324 within the geographic map.

Figure 7:
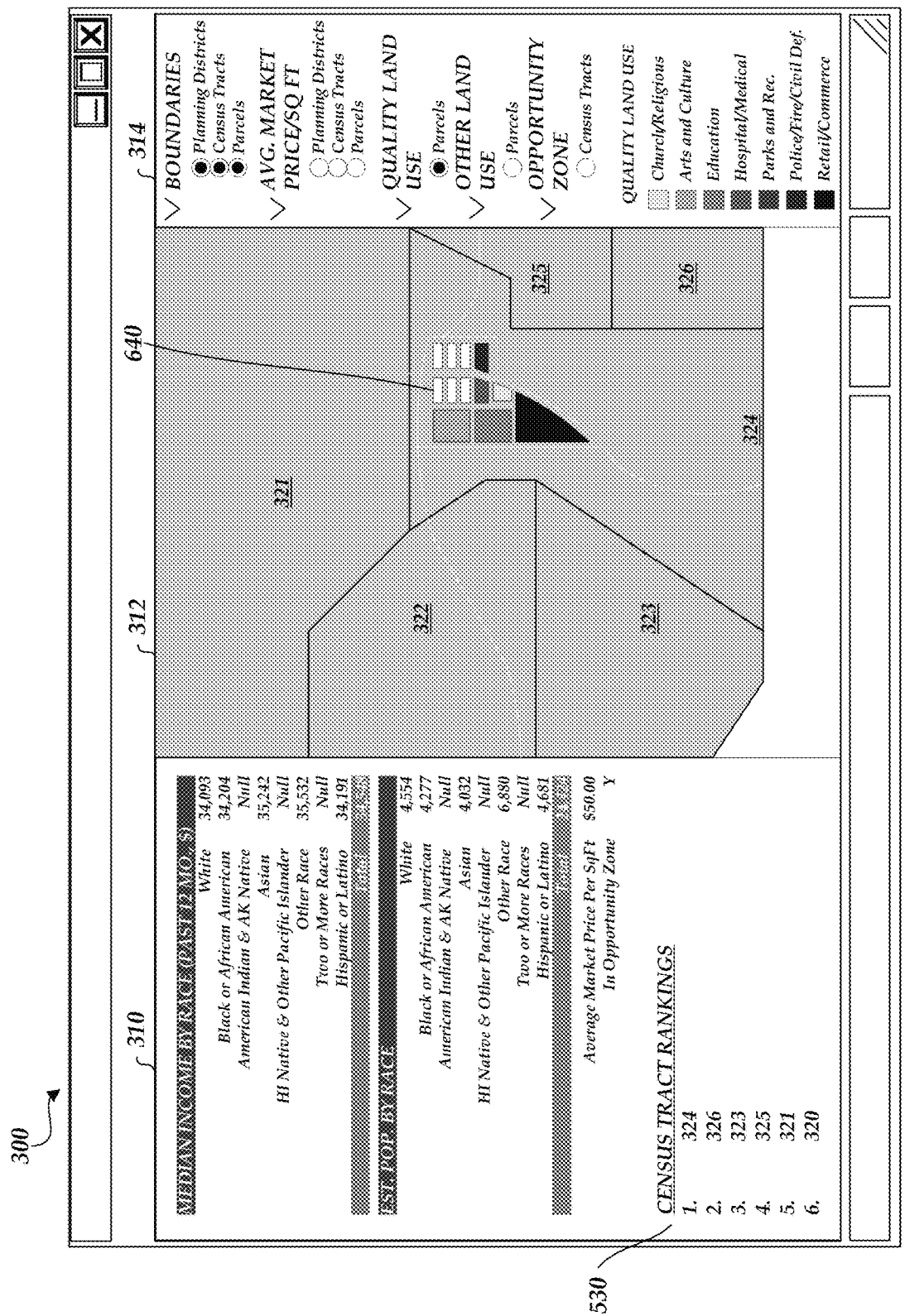

As explained above with respect to FIG. 4, changing a selection in the pane 314 may cause the information depicted in the pane 312 to change automatically. For example, if the user selects to view quality land use of individual parcels, as illustrated in FIG. 7, then the pane 312 may automatically update to show modified appearances of one or more of the graphical representations of the parcels that reflect the quality land use of the respective parcels. As an illustrative example, the graphical representation of the parcel 640 is shaded a darker color in FIG. 6 to reflect that the average market price per square foot of the parcel 640 is near the high end (e.g., near $150 per square foot). In response to a selection to view the quality land use of parcels, the user interface 300 automatically updates the appearance of the graphical representation of the parcel 640 to transition to a lighter color to reflect that the quality land use of the parcel 640 is residential (not shown in the legend).

Viewing either the user interface 300 depicted in FIG. 6 or 7, the user may be able to select a parcel on which to develop a housing project. For example, the user can select a desired parcel by selecting the graphical representation of the parcel depicted in the pane 312. Alternatively, while viewing the user interface 300 depicted in FIG. 6 or 7, the user can request that the development management system 120 recommend a parcel on which to develop a housing project. In response to the user requesting the development management system 120 recommend a parcel, the development management system 120 can use the trained parcel selection artificial intelligence model in a manner as described herein to identify a parcel on which to develop a housing project. In response to the user selecting a parcel or the trained parcel selection artificial intelligence model outputting an indication of a parcel to select, the user interface 300 can automatically modify an appearance of the pane 312 to zoom in on, highlight, or otherwise focus on the selected parcel and/or can automatically change one or more options available via the pane 314 and further modify the appearance of the graphical representation of the selected parcel accordingly.

Figure 8:
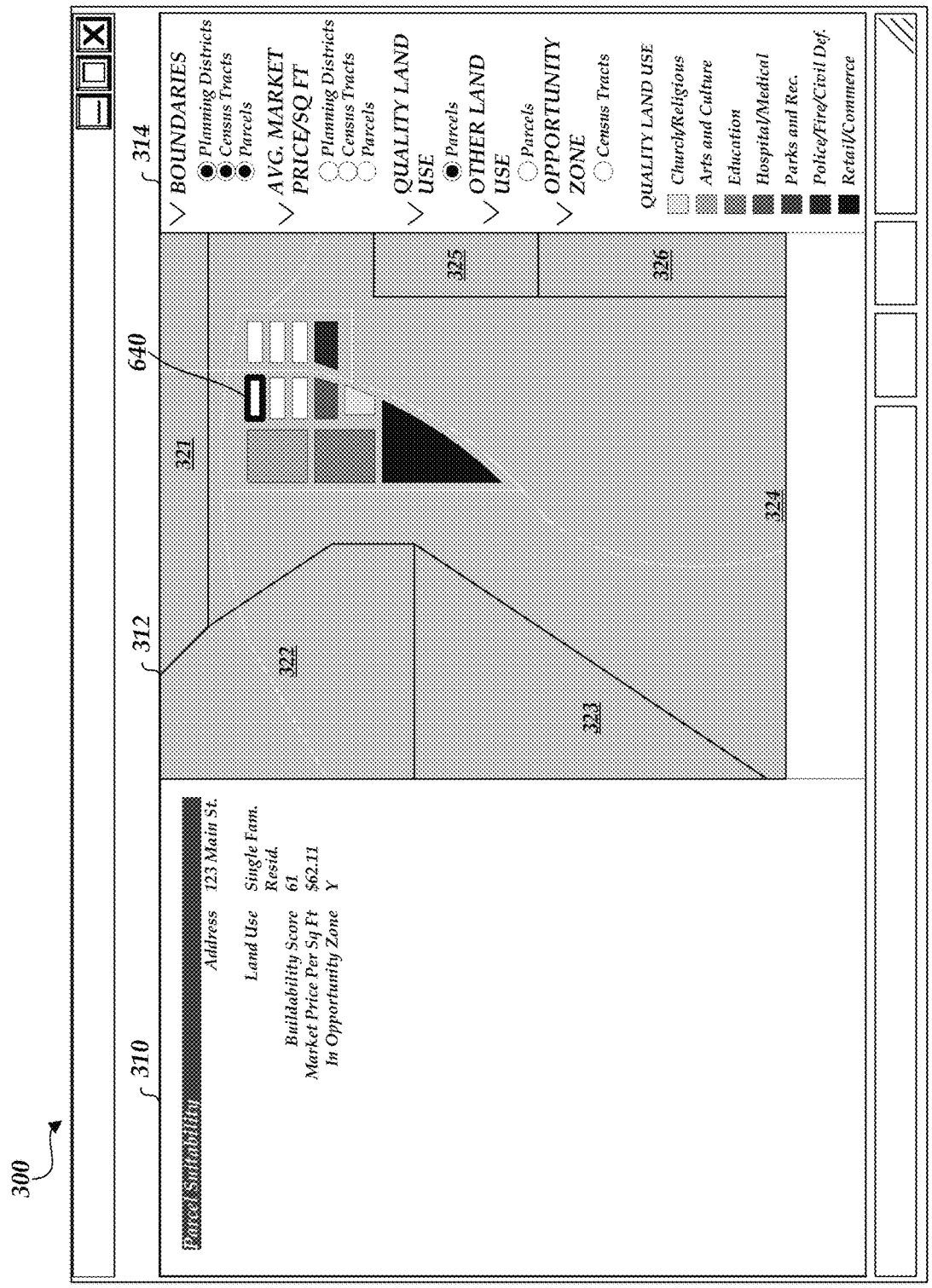
Figure 9:
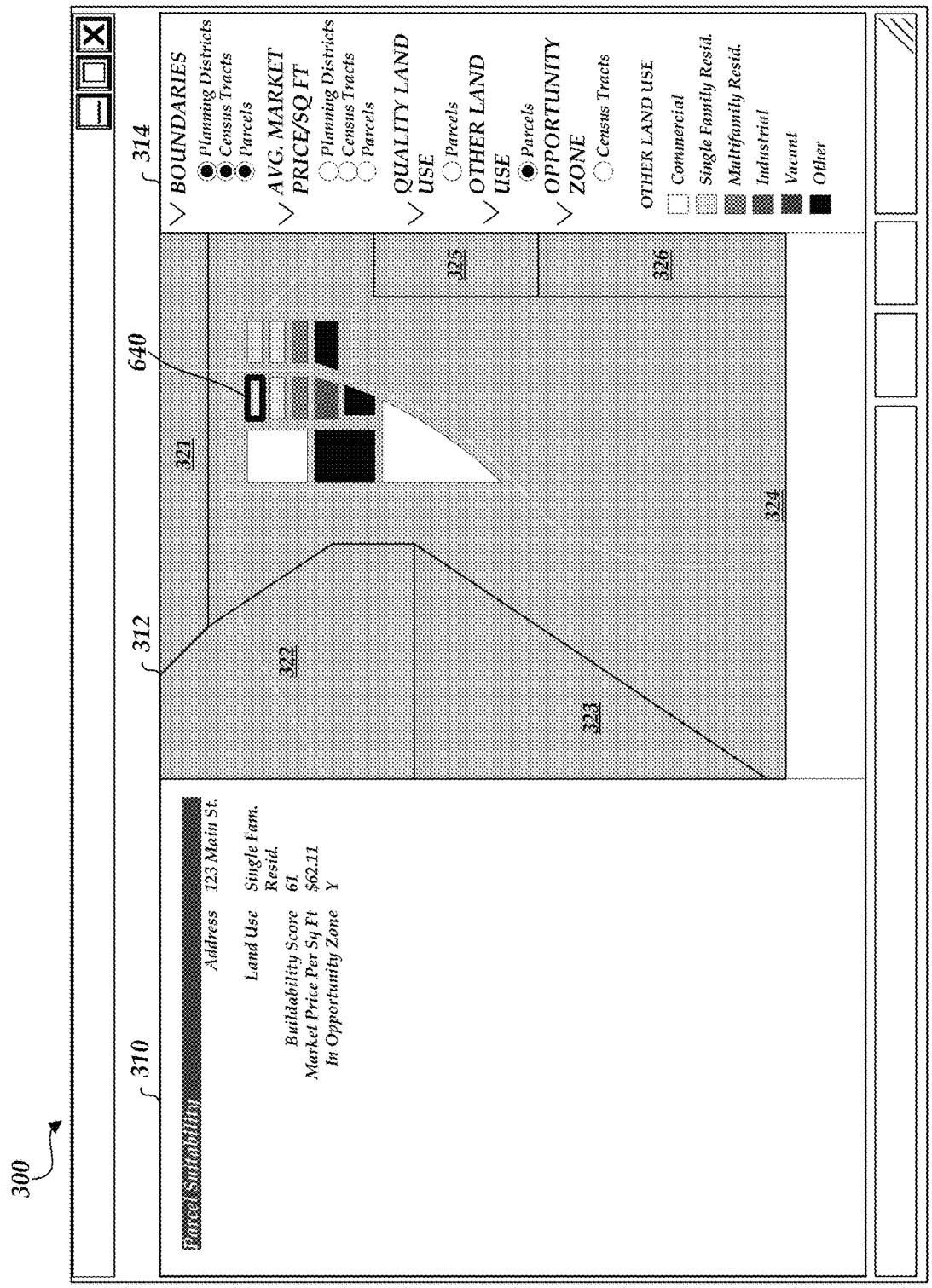

As illustrated in FIG. 8, the parcel 640 is selected (either by the user or by the development management system 120). As a result, the user interface 300 automatically updates to show parcel boundaries (if not already selected via the pane 314) and to show parcel quality land use (if not already selected via the pane 314) in the pane 312 (e.g., if such spatial layers are selected as development parameter(s)). The user interface 300 can also automatically update to show other content, such as average market price per square foot of parcels, other land use of parcels (as illustrated in FIG. 9), and/or census tract opportunity zone data (e.g., if such spatial layers are selected as development parameter(s)). Furthermore, the pane 310 automatically updates in response to the parcel selection to show information associated with the selected parcel 640 (e.g., address, land use, buildability score (which may indicate the profitability or safeness of building on the parcel, with a higher score indicating higher profitability or safeness), market price per square foot, etc.).

When the parcel is selected, the development management system 120 may automatically begin generating a building configuration and/or two-dimensional or three-dimensional model for the selected parcel. Automatically after a threshold time has passed or in response to a user selection, the user interface 300 may transition from displaying a geographic map of the selected region, neighborhood, and/or parcel in the pane 312 to displaying a rendering of the two-dimensional or three-dimensional model in the pane 312.

Figure 10:
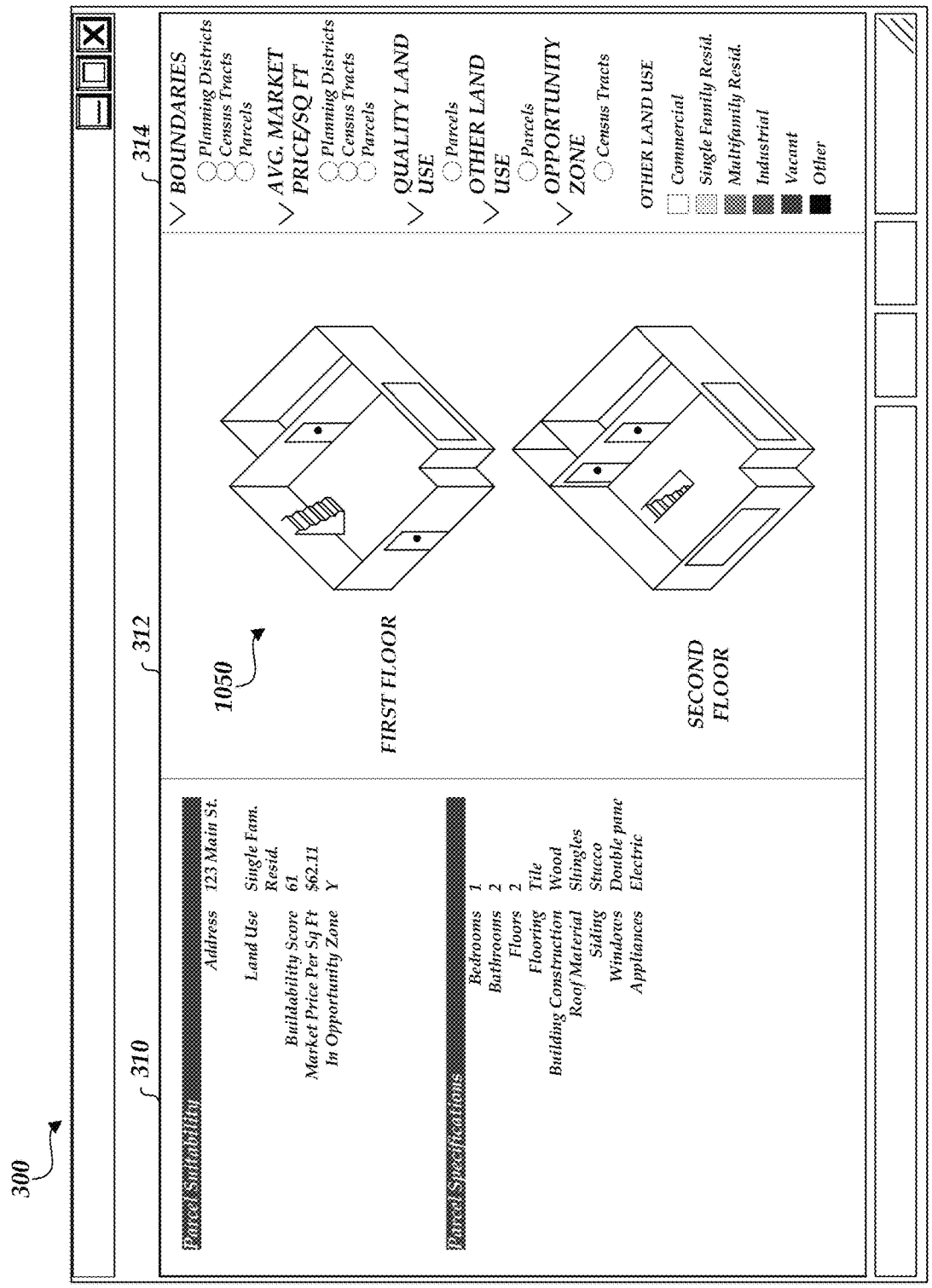

As illustrated in FIG. 10, a three-dimensional model 1050 of a building is depicted in the pane 312. While the three-dimensional model 1050 depicts a building or structure having two floors, this is not meant to be limiting. The models depicted in the page 312 can include any number of floors. The pane 310 may indicate different characteristics of specifications of the building represented by the three-dimensional model 1050, such as the number of bedrooms, the number of bathrooms, the number of floors, the type of flooring, the type of building construction, the type of roof material, the type of siding, the type of windows, the type of appliances, etc. determined by the development management system 120 to be included in the building configuration from which the three-dimensional model 1050 is derived.

In some embodiments, the user can manipulate the three-dimensional model 1050 via the user interface 300. For example, the user can hide or make visible different features of the three-dimensional model 1050 (e.g., hide or make visible a floor, a room, a bathroom, the flooring, the roof, sidings, windows, appliances, fixtures, windows, doors, etc.). The user can also pan, rotate, zoom in, zoom out, tilt, or otherwise change the view of the three-dimensional model 1050 depicted in the pane 312. As described herein, the three-dimensional model 1050 depicted in the pane 312 may be a graphical representation of a building configuration determined by the development management system 120 that meets building constraints (e.g., building codes) in the selected neighborhood and/or that reduces construction costs while maximizing the likelihood that the constructed building will be sold or rented within a threshold period of time. Nonetheless, the user can modify the configuration of the building by interacting with the three-dimensional model 1050 via the pane 312. For example, the user can select a room and enter a new dimension for the room, the user can select a wall depicted in the three-dimensional model 1050 and, while the wall is selected, drag a cursor toward an interior of the room or away from an interior of the room to change the dimension of the room, can use drawing tools available in the user interface 300 (not shown) to add an appliance, a room, a fixture, etc., can select a window and, while the window is selected, move a cursor to change a position of the window, can select a siding visible in the three-dimensional model 1050 and, via a dropdown menu, select a new type of siding, and/or the like.

The development management system 120 can track changes to the three-dimensional model 1050 and generate an updated building configuration based on the changes. In further embodiments, the development management system 120 can transmit the original and/or updated building configuration, including floorplan(s), building models, blueprints, and/or similar materials, to a construction system, where reception of the information serves as an instruction that causes the construction system to automatically order material(s) to be used in construction of the building according to the building configuration, cause a three-dimensional printer to begin printing one or more parts for use in construction of the building according to the building configuration, cause an unmanned aerial vehicle to fly to a location at which the development is planned (e.g., the identified parcel) and captures aerial images, cause construction equipment (e.g., autonomous or semi-autonomous bulldozers, cranes, cement mixers, etc.) to begin performing one or more construction actions (e.g., leveling a parcel, lifting beams, mixing cement, etc.) according to the building configuration, and/or the like.

Example Land Development Routine

Figure 11:
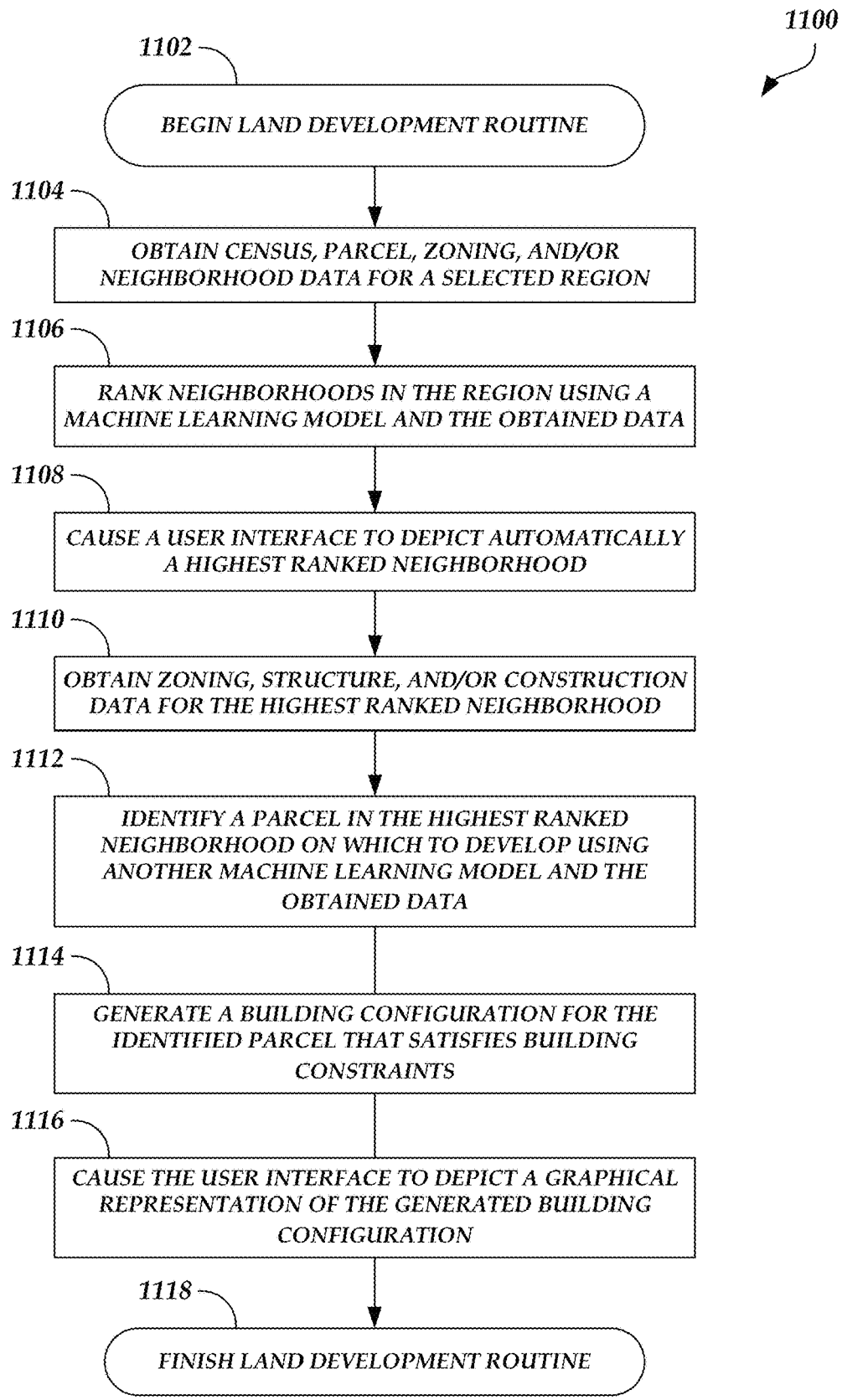
FIG. 11 is a flow diagram depicting a land development routine illustratively implemented by a development management system, according to one embodiment.

FIG. 11 is a flow diagram depicting a land development routine 1100 illustratively implemented by a development management system, according to one embodiment. As an example, the development management system 120 of FIG. 1 can be configured to execute the land development routine 1100. The land development routine 1100 begins at block 1102.

At block 1104, census, parcel, zoning, and/or neighborhood data is obtained for a selected region. For example, the region may be selected via a user interface, such as the user interface 300. In addition to selecting a region, a user may provide one or more development parameters.

At block 1106, neighborhoods in the region are ranked using a machine learning model and the obtained data. For example, the obtained data and/or the development parameter(s) may be provided as an input to the machine learning model, and the machine learning model may output the neighborhood rankings.

At block 1108, a user interface is caused to depict automatically a highest ranked neighborhood. For example, the user interface may zoom in on, highlight, annotate, or otherwise focus on a graphical representation of the highest ranked neighborhood.

At block 1110, zoning, structure, and/or construction data is obtained for the highest ranked neighborhood.

At block 1112, a parcel in the highest ranked neighborhood on which to develop is identified using another machine learning model and the obtained data. For example, the obtained data and/or the development parameter(s) may be provided as an input to the other machine learning model, and the other machine learning model may output an indication of a parcel.

At block 1114, a building configuration is generated for the identified parcel that satisfies building constraints. For example, the building configuration may be a data structure that includes data representing a layout of a building to be developed on the identified parcel.

At block 1116, the user interface is caused to depict a graphical representation of the generated building configuration. For example, the graphical representation may be a two-dimensional or three-dimensional model of the generated building configuration. After the user interface is caused to depict the graphical representation, the land development routine 1100 ends, as shown at block 1118.

Terminology

All of the methods and tasks described herein may be performed and fully automated by a computer system. The computer system may, in some cases, include multiple distinct computers or computing devices (e.g., physical servers, workstations, storage arrays, cloud computing resources, etc.) that communicate and interoperate over a network to perform the described functions. Each such computing device typically includes a processor (or multiple processors) that executes program instructions or modules stored in a memory or other non-transitory computer-readable storage medium or device (e.g., solid state storage devices, disk drives, etc.). The various functions disclosed herein may be embodied in such program instructions, or may be implemented in application-specific circuitry (e.g., ASICs or FPGAs) of the computer system. Where the computer system includes multiple computing devices, these devices may, but need not, be co-located. The results of the disclosed methods and tasks may be persistently stored by transforming physical storage devices, such as solid state memory chips or magnetic disks, into a different state. In some embodiments, the computer system may be a cloud-based computing system whose processing resources are shared by multiple distinct business entities or other users.

Depending on the embodiment, certain acts, events, or functions of any of the processes or algorithms described herein can be performed in a different sequence, can be added, merged, or left out altogether (e.g., not all described operations or events are necessary for the practice of the algorithm). Moreover, in certain embodiments, operations or events can be performed concurrently, e.g., through multi-threaded processing, interrupt processing, or multiple processors or processor cores or on other parallel architectures, rather than sequentially.

The various illustrative logical blocks, modules, routines, and algorithm steps described in connection with the embodiments disclosed herein can be implemented as electronic hardware (e.g., ASICs or FPGA devices), computer software that runs on computer hardware, or combinations of both. Moreover, the various illustrative logical blocks and modules described in connection with the embodiments disclosed herein can be implemented or performed by a machine, such as a processor device, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A processor device can be a microprocessor, but in the alternative, the processor device can be a controller, microcontroller, or logic circuitry that implements a state machine, combinations of the same, or the like. A processor device can include electrical circuitry configured to process computer-executable instructions. In another embodiment, a processor device includes an FPGA or other programmable device that performs logic operations without processing computer-executable instructions. A processor device can also be implemented as a combination of computing devices, e.g., a combination of a DSP and a microprocessor, a plurality of microprocessors, one or more microprocessors in conjunction with a DSP core, or any other such configuration. Although described herein primarily with respect to digital technology, a processor device may also include primarily analog components. For example, some or all of the rendering techniques described herein may be implemented in analog circuitry or mixed analog and digital circuitry. A computing environment can include any type of computer system, including, but not limited to, a computer system based on a microprocessor, a mainframe computer, a digital signal processor, a portable computing device, a device controller, or a computational engine within an appliance, to name a few.

The elements of a method, process, routine, or algorithm described in connection with the embodiments disclosed herein can be embodied directly in hardware, in a software module executed by a processor device, or in a combination of the two. A software module can reside in RAM memory, flash memory, ROM memory, EPROM memory, EEPROM memory, registers, hard disk, a removable disk, a CD-ROM, or any other form of a non-transitory computer-readable storage medium. An exemplary storage medium can be coupled to the processor device such that the processor device can read information from, and write information to, the storage medium. In the alternative, the storage medium can be integral to the processor device. The processor device and the storage medium can reside in an ASIC. The ASIC can reside in a user terminal. In the alternative, the processor device and the storage medium can reside as discrete components in a user terminal.

Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements or steps. Thus, such conditional language is not generally intended to imply that features, elements or steps are in any way required for one or more embodiments or that one or more embodiments necessarily include logic for deciding, with or without other input or prompting, whether these features, elements or steps are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, or Z). Thus, such disjunctive language is not generally intended to, and should not, imply that certain embodiments require at least one of X, at least one of Y, and at least one of Z to each be present.

While the above detailed description has shown, described, and pointed out novel features as applied to various embodiments, it can be understood that various omissions, substitutions, and changes in the form and details of the devices or algorithms illustrated can be made without departing from the spirit of the disclosure. As can be recognized, certain embodiments described herein can be embodied within a form that does not provide all of the features and benefits set forth herein, as some features can be used or practiced separately from others. The scope of certain embodiments disclosed herein is indicated by the appended claims rather than by the foregoing description. All changes which come within the meaning and range of equivalency of the claims are to be embraced within their scope.

What is claimed is:

1. A development management system for building a housing development, the development management system comprising:
    memory storing computer-executable instructions; and
    a hardware processor in communication with the memory, wherein the computer-executable instructions, when executed by the hardware processor, cause the hardware processor to:
        process a selection of one or more development parameters received via a user interface, wherein the user interface depicts a geographic map in a first pane;
        obtain region data for a region selected via the user interface, wherein the user interface displays a geographic map depicting the region, and wherein the region data comprises at least one of census data, parcel data, zoning data, or neighborhood data for the region;

apply the region data and the one or more development parameters as an input to an artificial intelligence model trained to rank one or more neighborhoods in the region;

cause the user interface to depict a ranking of the one or more neighborhoods in the region in a second pane and to modify automatically the geographic map to zoom in on a graphical representation of a highest ranked neighborhood in the ranking of the one or more neighborhoods in the geographic map in response to the artificial intelligence model producing an output;

obtain a selection of a parcel in the highest ranked neighborhood;

train a second artificial intelligence model using second training data, wherein the second training data comprises, for one or more completed housing developments, building characteristics of the respective completed housing development in the one or more completed housing developments that is annotated to indicate a net present value of the respective completed housing development;

apply one or more building constraints as an input to a second artificial intelligence model trained to generate a building configuration;

generate a second building configuration for the parcel based on an output of the second artificial intelligence model;

cause the user interface to depict a three-dimensional graphical representation of the generated second building configuration; and in response to a selection of a feature of the second building configuration depicted in the three-dimensional graphical representation of the generated second building configuration in the user interface and a movement of a cursor while the feature is selected, cause the three-dimensional graphical representation of the generated second building configuration to be modified to reflect a modification to the feature that is in accordance with the movement of the cursor.

2. The development management system of claim 1, wherein the computer-executable instructions, when executed, further cause the hardware processor to:

train a third artificial intelligence model using third training data, wherein the third training data comprises, for one or more parcels in a first neighborhood in the one or more neighborhoods, parcel data, zoning data, structure data, constructions data, and one or more development parameters for the respective parcel in the one or more parcels that is annotated to indicate whether a development on the respective parcel in the one or more parcels at least one of was completed, failed to complete, resulted in a profit, resulted in a loss, or was purchased within a threshold period of time;

obtain zoning, structure, or construction data for the highest ranked neighborhood;

apply the zoning data, the structure data, the construction data, and the one or more development parameters as an input to the third artificial intelligence model trained to identify a parcel on which to build the housing development; and obtain the selection of the parcel in the highest ranked neighborhood in response to the third artificial intelligence model producing a second output.

3. The development management system of claim 1, wherein the geographic map displays the geographic map depicting the region and the highest ranked neighborhood in the region prior to the region data and the one or more development parameters being applied as the input to the artificial intelligence model, and wherein the computer-executable instructions, when executed, further cause the hardware processor to cause the user interface to modify an appearance of the graphical representation of the highest ranked neighborhood to depict the parcel and one or more other parcels within a boundary of the graphical representation of the highest ranked neighborhood.

4. The development management system of claim 3, wherein the computer-executable instructions, when executed, further cause the hardware processor to cause the user interface to depict a graphical representation of the parcel within the boundary of the graphical representation of the highest ranked neighborhood with a color that represents a land use of the parcel.

5. The development management system of claim 1, wherein the second building configuration comprises a data structure comprising data that represents a layout of the housing development.

6. The development management system of claim 5, wherein the layout of the housing development comprises a layout of one or more floors of the housing development.

7. The development management system of claim 1, wherein the computer-executable instructions, when executed, further cause the hardware processor to modify the generated second building configuration in accordance with the modification to the three-dimensional model.

8. The development management system of claim 1, wherein the computer-executable instructions, when executed, further cause the hardware processor to instruct a construction system to one of cause a printer to begin printing a part for constructing the housing development in accordance with the generated second building configuration, cause an unmanned aerial vehicle to capture an aerial image of a location of the parcel, or cause construction equipment to begin performing one or more construction actions in accordance with the generated second building configuration.

9. A computer-implemented method for building a housing development, the computer-implemented method comprising:

as implemented by one or more computing devices configured with specific computer-executable instructions, receiving a selection of one or more development parameters via a user interface, wherein the user interface depicts a geographic map in a first pane;

obtaining region data for a region selected via the user interface, wherein the user interface displays a geographic map depicting the region, and wherein the region data comprises at least one of census data, parcel data, zoning data, or neighborhood data for the region;

applying the region data and the one or more development parameters as an input to an artificial intelligence model;

causing the user interface to depict a ranking of the one or more neighborhoods in the region output by the artificial intelligence model in a second pane and to modify automatically the geographic map to zoom in on a graphical representation of a first neighborhood in the one or more neighborhoods in the geographic map in response to the artificial intelligence model producing the output;

obtaining a selection of a parcel in the first neighborhood;

training a second artificial intelligence model using second training data, wherein the second training data comprises, for one or more completed housing developments, building characteristics of the respective completed housing development in the one or more completed housing developments that is annotated to indicate a net present value of the respective completed housing development;
applying one or more building constraints as an input to a second artificial intelligence model trained to generate a building configuration;
generating a second building configuration for the parcel based on a second output of the second artificial intelligence model;
causing the user interface to depict a three-dimensional graphical representation of the generated second building configuration; and
in response to a selection of a feature of the second building configuration depicted in the three-dimensional graphical representation of the generated second building configuration in the user interface and a movement of a cursor while the feature is selected, causing the three-dimensional graphical representation of the generated second building configuration to be modified to reflect a modification to the feature that is in accordance with the movement of the cursor.

10. The computer-implemented method of claim 9, wherein obtaining a selection of a parcel in the first neighborhood further comprises:
training a third artificial intelligence model using third training data, wherein the third training data comprises, for one or more parcels in a first neighborhood in the one or more neighborhoods, parcel data, zoning data, structure data, constructions data, and one or more development parameters for the respective parcel in the one or more parcels that is annotated to indicate whether a development on the respective parcel in the one or more parcels at least one of was completed, failed to complete, resulted in a profit, resulted in a loss, or was purchased within a threshold period of time;
obtaining zoning, structure, or construction data for the first ranked neighborhood;
applying the zoning data, the structure data, the construction data, and the one or more development parameters as an input to the third artificial intelligence model; and
obtaining the selection of the parcel in the first neighborhood in response to the third artificial intelligence model producing a second output.

11. The computer-implemented method of claim 9, wherein the geographic map displays the geographic map depicting the region and the first neighborhood in the region prior to the region data and the one or more development parameters being applied as the input to the artificial intelligence model, and wherein cause the user interface to depict a ranking of the one or more neighborhoods in the region output by the artificial intelligence model and a graphical representation of a first neighborhood in the one or more neighborhoods in the geographic map further comprises causing the user interface to modify an appearance of the graphical representation of the first neighborhood to depict the parcel and one or more other parcels within a boundary of the graphical representation of the first neighborhood.

12. The computer-implemented method of claim 11, wherein causing the user interface to modify an appearance of the graphical representation of the first neighborhood further comprises causing the user interface to depict a graphical representation of the parcel within the boundary of the graphical representation of the first neighborhood with a color that represents a land use of the parcel.

13. The computer-implemented method of claim 9, wherein the second building configuration comprises a data structure comprising data that represents a layout of the housing development.

14. The computer-implemented method of claim 9, further comprising modifying the generated second building configuration in accordance with the modification to the three-dimensional model.

15. The computer-implemented method of claim 9, further comprising instructing a construction system to one of cause a printer to begin printing a part for constructing the housing development in accordance with the generated second building configuration, cause an unmanned aerial vehicle to capture an aerial image of a location of the parcel, or cause construction equipment to begin performing one or more construction actions in accordance with the generated second building configuration.

16. Non-transitory, computer-readable storage media comprising computer-executable instructions for building a housing development, wherein the computer-executable instructions, when executed by a computer system, cause the computer system to:
process a selection of one or more development parameters received via a user interface;
obtain region data for a region selected via the user interface, wherein the user interface displays a geographic map depicting the region, and wherein the region data comprises at least one of census data, parcel data, zoning data, or neighborhood data for the region;
apply the region data and the one or more development parameters as an input to an artificial intelligence model;
cause the user interface to depict a ranking of the one or more neighborhoods in the region output by the artificial intelligence model and a graphical representation of a first neighborhood in the one or more neighborhoods in the geographic map in response to the artificial intelligence model producing the output;
obtain a selection of a parcel in the first neighborhood;
train a second artificial intelligence model using second training data, wherein the second training data comprises, for one or more completed housing developments, building characteristics of the respective completed housing development in the one or more completed housing developments that is annotated to indicate a net present value of the respective completed housing development;
apply one or more building constraints as an input to a second artificial intelligence model trained to generate a building configuration;
generate a second building configuration for the parcel based on a second output of the second artificial intelligence model; and
cause the user interface to depict a graphical representation of the generated second building configuration.

17. The non-transitory, computer-readable storage media of claim 16, wherein the computer-executable instructions further cause the computer system to instruct a construction system to one of cause a printer to begin printing a part for constructing the housing development in accordance with the generated second building configuration, cause an unmanned aerial vehicle to capture an aerial image of a location of the parcel, or cause construction equipment to begin performing one or more construction actions in accordance with the generated second building configuration.

18. The development management system of claim 1, wherein the feature comprises one of a wall of the second building configuration, a window of the second building configuration, or a siding of the second building configuration.

19. The development management system of claim 1, wherein the computer-executable instructions, when executed, further cause the hardware processor to train the artificial intelligence model using training data, wherein the training data comprises, for the one or more neighborhoods, census data, parcel data, zoning data, neighborhood data, and one or more development parameters for the respective neighborhood in the one or more neighborhoods that is annotated to indicate at least one of a percentage of developments completed, a percentage of developments that failed to complete, a percentage of developments that resulted in a profit, a percentage of developments that resulted in a loss, or a percentage of developments that were purchased within a threshold period of time.

20. A development management system for building a housing development, the development management system comprising:

memory storing computer-executable instructions; and
a hardware processor in communication with the memory, wherein the computer-executable instructions, when executed by the hardware processor, cause the hardware processor to:
process a selection of one or more development parameters received via a user interface, wherein the user interface depicts a geographic map in a first pane;
obtain region data for a region selected via the user interface, wherein the user interface displays a geographic map depicting the region, and wherein the region data comprises at least one of census data, parcel data, zoning data, or neighborhood data for the region;
apply the region data and the one or more development parameters as an input to an artificial intelligence model trained to rank one or more neighborhoods in the region;
cause the user interface to depict a ranking of the one or more neighborhoods in the region in a second pane and to modify automatically the geographic map to zoom in on a graphical representation of a highest ranked neighborhood in the ranking of the one or more neighborhoods in the geographic map in response to the artificial intelligence model producing an output;
train a second artificial intelligence model using second training data, wherein the second training data comprises, for one or more parcels in a first neighborhood in the one or more neighborhoods, parcel data, zoning data, structure data, constructions data, and one or more development parameters for the respective parcel in the one or more parcels that is annotated to indicate whether a development on the respective parcel in the one or more parcels at least one of was completed, failed to complete, resulted in a profit, resulted in a loss, or was purchased within a threshold period of time;
obtain zoning, structure, or construction data for the highest ranked neighborhood;
apply the zoning data, the structure data, the construction data, and the one or more development parameters as an input to the second artificial intelligence model trained to identify a parcel on which to build the housing development;
obtain a selection of a parcel in the highest ranked neighborhood in response to the second artificial intelligence model producing a second output;
generate a building configuration for the parcel that satisfies one or more building constraints;
cause the user interface to depict a three-dimensional graphical representation of the generated building configuration; and
in response to a selection of a feature of the building configuration depicted in the three-dimensional graphical representation of the generated building configuration in the user interface and a movement of a cursor while the feature is selected, cause the three-dimensional graphical representation of the generated building configuration to be modified to reflect a modification to the feature that is in accordance with the movement of the cursor.

21. A development management system for building a housing development, the development management system comprising:

memory storing computer-executable instructions; and
a hardware processor in communication with the memory, wherein the computer-executable instructions, when executed by the hardware processor, cause the hardware processor to:
train an artificial intelligence model to rank one or more neighborhoods using training data, wherein the training data comprises, for the one or more neighborhoods, census data, parcel data, zoning data, neighborhood data, and one or more development parameters for the respective neighborhood in the one or more neighborhoods that is annotated to indicate at least one of a percentage of developments completed, a percentage of developments that failed to complete, a percentage of developments that resulted in a profit, a percentage of developments that resulted in a loss, or a percentage of developments that were purchased within a threshold period of time;
process a selection of one or more development parameters received via a user interface, wherein the user interface depicts a geographic map in a first pane;
obtain region data for a region selected via the user interface, wherein the user interface displays a geographic map depicting the region, and wherein the region data comprises at least one of census data, parcel data, zoning data, or neighborhood data for the region;
apply the region data and the one or more development parameters as an input to the artificial intelligence model;
cause the user interface to depict a ranking of the one or more neighborhoods in the region in a second pane and to modify automatically the geographic map to zoom in on a graphical representation of a highest ranked neighborhood in the ranking of the one or more neighborhoods in the geographic map in response to the artificial intelligence model producing an output;
obtain a selection of a parcel in the highest ranked neighborhood;
generate a building configuration for the parcel that satisfies one or more building constraints;
cause the user interface to depict a three-dimensional graphical representation of the generated building configuration; and in response to a selection of a feature of the building configuration depicted in the three-dimensional graphical representation of the generated building configuration in the user interface and a movement of a cursor while the feature is selected, cause the three-dimensional graphical representation of the generated building configuration to be modified to reflect a modification to the feature that is in accordance with the movement of the cursor.

22. A computer-implemented method for building a housing development, the computer-implemented method comprising:

as implemented by one or more computing devices configured with specific computer-executable instructions, receiving a selection of one or more development parameters via a user interface, wherein the user interface depicts a geographic map in a first pane;

obtaining region data for a region selected via the user interface, wherein the user interface displays a geographic map depicting the region, and wherein the region data comprises at least one of census data, parcel data, zoning data, or neighborhood data for the region;

applying the region data and the one or more development parameters as an input to an artificial intelligence model;

causing the user interface to depict a ranking of the one or more neighborhoods in the region output by the artificial intelligence model in a second pane and to modify automatically the geographic map to zoom in on a graphical representation of a first neighborhood in the one or more neighborhoods in the geographic map in response to the artificial intelligence model producing the output;

training a second artificial intelligence model using second training data, wherein the second training data comprises, for one or more parcels in a first neighborhood in the one or more neighborhoods, parcel data, zoning data, structure data, constructions data, and one or more development parameters for the respective parcel in the one or more parcels that is annotated to indicate whether a development on the respective parcel in the one or more parcels at least one of was completed, failed to complete, resulted in a profit, resulted in a loss, or was purchased within a threshold period of time;

obtaining zoning, structure, or construction data for the first ranked neighborhood;

applying the zoning data, the structure data, the construction data, and the one or more development parameters as an input to the second artificial intelligence model;

obtaining a selection of a parcel in the first neighborhood in response to the second artificial intelligence model producing a second output;

generating a building configuration for the parcel that satisfies one or more building constraints;

causing the user interface to depict a three-dimensional graphical representation of the generated building configuration; and in response to a selection of a feature of the building configuration depicted in the three-dimensional graphical representation of the generated building configuration in the user interface and a movement of a cursor while the feature is selected, causing the three-dimensional graphical representation of the generated building configuration to be modified to reflect a modification to the feature that is in accordance with the movement of the cursor.

* * * * *